(12) United States Patent
Murai et al.

(10) Patent No.: US 8,581,257 B2
(45) Date of Patent: Nov. 12, 2013

(54) CIRCUIT BOARD AND DISPLAY DEVICE

(75) Inventors: Atsuhito Murai, Osaka (JP); Shinya Tanaka, Osaka (JP); Hideki Kitagawa, Osaka (JP); Hajime Imai, Osaka (JP); Mitsunori Imade, Osaka (JP); Tetsuo Kikuchi, Osaka (JP); Kazunori Morimoto, Osaka (JP); Junya Shimada, Osaka (JP); Jun Nishimura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/639,138

(22) PCT Filed: Jan. 17, 2011

(86) PCT No.: PCT/JP2011/050658
§ 371 (c)(1),
(2), (4) Date: Dec. 5, 2012

(87) PCT Pub. No.: WO2011/125353
PCT Pub. Date: Oct. 13, 2011

(65) Prior Publication Data
US 2013/0092927 A1    Apr. 18, 2013

(30) Foreign Application Priority Data
Apr. 7, 2010  (JP) ................. 2010-0887365

(51) Int. Cl.
*H01L 29/04*    (2006.01)
*H01L 29/10*    (2006.01)
*H01L 31/00*    (2006.01)

(52) U.S. Cl.
USPC ............... 257/59; 257/72; 257/66; 257/347; 257/350; 257/351; 438/30; 438/158; 438/151; 438/154; 438/149; 349/42; 349/43; 345/205; 345/92

(58) Field of Classification Search
USPC ............... 257/59, 72, 66, 347, 350, 351, 353, 257/355, 369, 381, 67, 758; 438/30, 158, 438/151, 154, 149, 153, 163, 164, 24; 349/42, 43; 345/205, 92
See application file for complete search history.

(56) References Cited

U.S. PATENT DOCUMENTS

| 2010/0051936 A1 | 3/2010 | Hayashi et al. |
| 2010/0065837 A1 | 3/2010 | Omura et al. |
| 2010/0231562 A1 | 9/2010 | Brown |

(Continued)

FOREIGN PATENT DOCUMENTS

| JP | 05-107560 A | 4/1993 |
| JP | 10-293322 A | 11/1998 |

(Continued)

OTHER PUBLICATIONS

Official Communication issued in International Patent Application No. PCT/JP2011/050658, mailed on Apr. 5, 2011.

*Primary Examiner* — Telly Green
(74) *Attorney, Agent, or Firm* — Keating & Bennett, LLP

(57) ABSTRACT

The circuit board (1) of the present invention includes a plurality of transistor elements provided on a single insulating substrate (2) for respective pixels that are two-dimensionally arranged or respective pixels in a group of a predetermined number of the pixels. At least one of the plurality of transistor elements is an oxide TFT (10) having a channel layer (11) formed by an oxide semiconductor, and at least another of the plurality of transistor elements is an a-Si TFT (20) having a channel layer (21) formed by, for example, an amorphous silicon semiconductor. Each of the oxide TFT (10) and the a-Si TFT (20) is a bottom-gate transistor.

16 Claims, 11 Drawing Sheets

(56) References Cited

U.S. PATENT DOCUMENTS

2010/0276604 A1    11/2010    Okada

FOREIGN PATENT DOCUMENTS

| | | |
|---|---|---|
| JP | 2003-273366 A | 9/2003 |
| JP | 2005-072126 A | 3/2005 |
| JP | 2008-166716 A | 7/2008 |
| JP | 2009-075385 A | 4/2009 |
| JP | 2009-540396 A | 11/2009 |
| JP | 2010-073881 A | 4/2010 |
| WO | 2007/145347 A1 | 12/2007 |
| WO | 2009/025120 A1 | 2/2009 |
| WO | 2011/135908 A1 | 11/2011 |
| WO | 2011/135920 A1 | 11/2011 |

CIRCUIT BOARD AND DISPLAY DEVICE

TECHNICAL FIELD

The present invention relates to (i) a circuit board including a thin film transistor, (ii) a display device including the circuit board, and (iii) a method for manufacturing the circuit board.

BACKGROUND ART

A thin film transistor (TFT) has been widely used as, for example, (i) a circuit element for switching of a pixel in a liquid crystal display device (LCD) or (ii) a circuit element included in a driver of an LCD. In recent years, in order to achieve improvements such as a large screen, high definition, and high frame rate which are demanded of LCDs, TFTs are also increasingly demanded to achieve high performance and high reliability.

In accordance with such growing demands for high performance and high reliability of TFTs, types of TFTs are diversifying depending on types of semiconductors which can be used to form channel layers. Among such TFTs, (i) mass production techniques have been established for a single crystal silicon TFT, an amorphous silicon (a-Si) TFT, and a polycrystalline silicon (poly-Si) TFT and (ii) research and development is actively carried out with respect to a microcrystalline silicon (μc-Si) TFT, an oxide TFT, and an organic TFT.

Patent Literature 1 discloses a configuration of and a method for manufacturing a TFT in which a transparent conductive oxide semiconductor such as ZnO is used as a channel layer. The oxide semiconductor can be formed into a film at a low temperature and is transparent with respect to visible light. It is therefore possible to form a flexible and transparent TFT on a substrate such as a plastic plate and a film.

FIG. 14 is a cross sectional view illustrating a configuration of a conventional bottom-gate (inversely staggered) TFT. In the TFT, a gate electrode 102 is provided on a substrate 101, and thereon a first insulating film 103, an oxide semiconductor layer 104 serving as a channel layer, a second insulating film 105 serving as an etching stop layer, a source electrode 106, and a drain electrode 107 are provided.

In a case where the oxide semiconductor layer 104 is made of an amorphous oxide containing In, Zn, and O, the oxide semiconductor layer 104 can be prepared at a room temperature. Therefore, all film formation processes can be carried out at the room temperature, provided that the insulating films are formed by sputtering. The substrate can be a plastic substrate, a plastic film, or the like.

Patent Literature 1 also discloses that the source electrode 106 and the drain electrode 107 can be formed by patterning carried out by wet etching as well as dry etching, because the second insulating film 105 protects a channel region.

Note that Patent Literature 2 discloses a single transistor optical sensor circuit, which will be described later as an embodiment.

Patent Literature 3 discloses a circuit board in which (i) a photoelectric transducer having a light receiving section formed by an amorphous semiconductor and (ii) a switching element having a semiconductor layer formed by a polycrystalline semiconductor are provided on a light-transmitting substrate.

Patent Literature 4 discloses a liquid crystal display device including (i) a pixel switch formed by a non-single crystalline semiconductor and (ii) a peripheral driving circuit for driving the pixel switch, which peripheral driving circuit is formed by a single crystalline semiconductor. The pixel switch and the peripheral driving circuit are provided in a pixel display section.

CITATION LIST

Patent Literatures

[Patent Literature 1]
Japanese Patent Application Publication Tokukai No. 2008-166716 A (Publication date: Jul. 17, 2008)
[Patent Literature 2]
International Publication WO 2007-145347 (Publication date: Dec. 21, 2007)
[Patent Literature 3]
Japanese Patent Application Publication Tokukai No. 2005-72126 A (Publication date: Mar. 17, 2005)
[Patent Literature 4]
Japanese Patent Application Publication Tokukaihei No. 10-293322 A (Publication date: Nov. 4, 1998)
[Patent Literature 5]
International Publication WO 2009-025120 (Publication date: Feb. 26, 2009)

SUMMARY OF INVENTION

Technical Problem

According to the configurations disclosed in Patent Literatures 3 and 4, TFTs having different characteristics are provided on an identical substrate. However, all the TFTs are top-gate (normally staggered) TFTs. In a case where the configuration disclosed in Patent Literature 3 or 4 is applied to a backlight type display device in which pixels are irradiated with light for display emitted from a side opposite to a display surface, the light for display directly enters a semiconductor layer (channel layer). This causes a problem of rise in OFF current of the TFT, property change over time, and/or deterioration.

In a case where the circuit board of Patent Literature 3 is applied to a display device which has, for example, a touch panel function and can concurrently carry out (i) lighting of a backlight for an image display and (ii) sensing for detecting a touched position, the light for display causes noise in the sensing.

Under the circumstances, in order to prevent the light for display from directly entering the channel layer, it is necessary to provide a light-shielding layer under the channel layer. This causes a prolongation of manufacturing processes and an increase in cost.

The present invention is accomplished in view of the problem, and its object is to provide (i) a configuration enabling a circuit board, including a plurality of TFTs formed by different types of semiconductors, to sufficiently give its performance at low cost and (ii) a manufacturing method for obtaining the configuration.

Solution to Problem

According to a circuit board of the present invention,
(1) the circuit board includes an insulating substrate and a plurality of transistor elements provided on the insulating substrate, the plurality of transistor elements being provided for (i) respective pixels arranged in a matrix manner or (ii) respective pixels in a group of a predetermined number of the pixels, (2) at least one of the plurality of transistor elements is a first thin film transistor element having a first channel layer formed by an oxide semiconductor, (3) at least another one of the plurality of transistor elements is a second thin film transistor element having a second channel layer formed by (i) an amorphous silicon semiconductor, (ii) a microcrystalline silicon semiconductor, or (iii) a semiconductor in which the amorphous silicon semiconductor and the microcrystalline silicon semiconductor are stacked, and (4) each of the first thin film transistor element and the second thin film transistor element is a bottom-gate transistor.

According to the configuration, the first thin film transistor element, in which the oxide semiconductor is provided as the channel layer (also called "semiconductor layer" or "active layer"), has a first characteristic that a high output voltage can be obtained without increasing a size of the first thin film transistor element.

On the other hand, the second thin film transistor element, which has the channel layer formed by non-oxide semiconductor, that is, (i) an amorphous silicon semiconductor, (ii) a microcrystalline silicon semiconductor, or (iii) a semiconductor in which the amorphous silicon semiconductor and the microcrystalline silicon semiconductor are stacked, has a second characteristic of being highly photosensitive and having a high resistance.

Therefore, it is possible to provide a circuit board in which electric circuits having respective characteristics are provided on an identical insulating substrate.

The first thin film transistor element having the first characteristic can be formed in a small size. Therefore, the first thin film transistor element is suitable for, for example, a switching element of a pixel or an output element of an optical sensor circuit provided for each pixel or for each group of a plurality of pixels. In this case, it is possible to suppress a decrease in aperture ratio of each of the pixels.

The second thin film transistor element having the second characteristic is suitable for, for example, an optical sensor element of the optical sensor circuit or a circuit element included in a protection circuit for protecting the switching element in a circuit.

In a case where the second thin film transistor element is used as the optical sensor element, it is possible to provide a circuit board suitable for a display device having a touch panel function.

In a case where the circuit board is applied to a backlight type display device in which pixels are irradiated with light for display emitted from a side opposite to a display surface, the following advantageous effect can be further brought about. That is, because the gate electrode of each of the thin film transistor element blocks the light for display, it is particularly possible to prevent a deterioration in characteristics of the first thin film transistor element, without separately providing a light-shielding film.

In addition, it is also possible to block, by the gate electrode, the light for display which light causes noise in sensing carried out by the second thin film transistor element.

According to the configuration, it is unnecessary to separately provide a light-shielding layer. This brings about an effect of enabling a circuit board, including a plurality of thin film transistor elements formed by different types of semiconductors, to sufficiently give its performance at low cost.

Note that features (5) through (18) of the circuit board of the present invention will be described later in Description of Embodiments.

According to a method of the present invention for manufacturing a circuit board,

(19) the method is a method for manufacturing a circuit board in which a first thin film transistor element and a second thin film transistor element are provided on an identical insulating substrate, the first and second thin film transistor elements having respective first and second channel layers which are formed by respective different semiconductors,

(20) the method includes the step of (1) forming first and second gate electrodes of the respective first and second thin film transistor elements by patterning a single conductive layer formed on the insulating substrate;

(21) the method includes the step of (2) forming a gate insulating film over the first and the second gate electrodes; and

(22) the method includes the step of (3) forming (i) a first source electrode and a first drain electrode of the first thin film transistor element and (ii) a second source electrode and a second drain electrode of the second thin film transistor element, by patterning a single conductive layer after forming first and second channel layers of the respective first and second thin film transistor elements.

According to the configuration, it is possible to manufacture a circuit board having high performance at low cost, as above described for the circuit board of the present invention.

Note that a combination of a feature recited in a certain claim and a feature recited in other claim is not limited to a combination of the feature recited in the certain claim and a feature recited in a claim cited by the certain claim. It is therefore possible to combine the feature recited in the certain claim and a feature recited in a claim which is not cited by the certain claim, provided that the object of the present invention can be attained.

Advantageous Effects of Invention

As above described, the circuit board of the present invention includes: an insulating substrate; and a plurality of transistor elements provided on the insulating substrate, the plurality of transistor elements being provided for (i) respective pixels arranged in a matrix manner or (ii) respective pixels in a group of a predetermined number of the pixels, at least one of the plurality of transistor elements being a first thin film transistor element having a first channel layer formed by an oxide semiconductor, at least another one of the plurality of transistor elements being a second thin film transistor element having a second channel layer formed by (i) an amorphous silicon semiconductor, (ii) a microcrystalline silicon semiconductor, or (iii) a semiconductor in which the amorphous silicon semiconductor and the microcrystalline silicon semiconductor are stacked, and each of the first thin film transistor element and the second thin film transistor element being a bottom-gate transistor.

This brings about an effect of enabling a circuit board, including a plurality of thin film transistor elements formed by different types of semiconductors, to sufficiently give its performance at low cost.

As above mentioned, the method of the present invention for manufacturing a circuit board includes the steps of: (1) forming first and second gate electrodes of the respective first and second thin film transistor elements by patterning a single conductive layer formed on the insulating substrate; (2) forming a gate insulating film over the first and the second gate electrodes; and (3) forming (i) a first source electrode and a first drain electrode of the first thin film transistor element and (ii) a second source electrode and a second drain electrode of the second thin film transistor element, by patterning a single conductive layer after forming first and second channel layers of the respective first and second thin film transistor elements.

This brings about an effect of manufacturing a circuit board having high performance at low cost.

DESCRIPTION OF EMBODIMENTS

Embodiment 1

The following description will discuss Embodiment 1 of the present invention with reference to drawings. Note, however, that the descriptions of dimensions, materials, and shapes of constituent members, and their relative configurations etc. in Embodiment 1 merely exemplify an embodiment of the present invention, and therefore should not be construed as limiting the scope of the invention only to them unless otherwise noted.

(Basic Configuration of Circuit Board)

Figure 1:
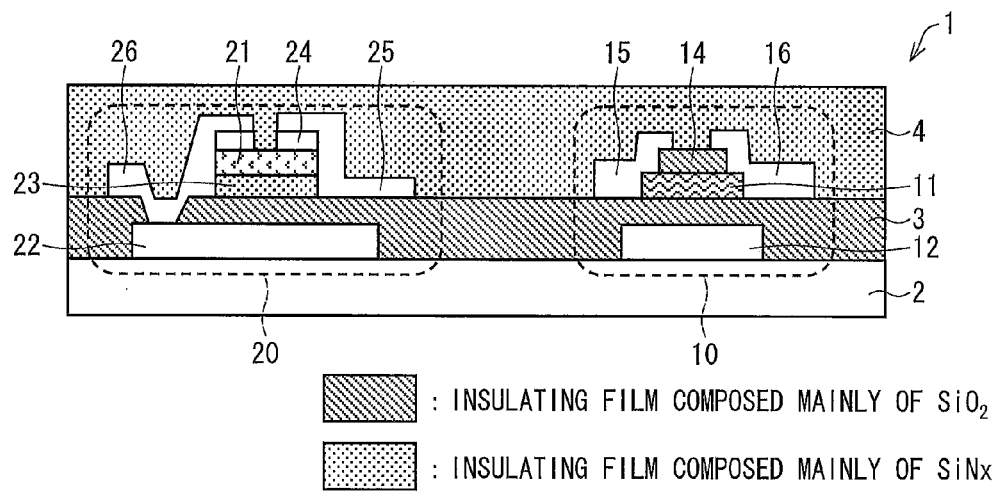
FIG. 1 is a cross sectional view schematically illustrating a basic configuration of a circuit board, in accordance with an embodiment of the present invention.

The following description will discuss a basic configuration of a circuit board 1 in accordance with the present invention, with reference to FIG. 1. FIG. 1 is a cross sectional view schematically illustrating a basic configuration of the circuit board 1.

The circuit board 1 includes a plurality of transistor elements provided on an insulating substrate 2 (see FIG. 1). The plurality of transistor elements are provided for (i) respective pixels arranged in a matrix manner (see FIG. 3) or (ii) respective predetermined number of pixels in a group.

At least one of the plurality of transistor elements is a first thin film transistor element 10 which includes an oxide semiconductor as a channel layer (also called "semiconductor layer" or "active layer") 11. Hereinafter, the first thin film transistor element 10 is referred to as "oxide TFT 10." An amorphous oxide material such as In—Ga—Zn—O is suitable for the oxide semiconductor. Alternatively, a polycrystalline material such as zinc oxide (ZnO) can be used as the oxide semiconductor.

At least another of the plurality of transistor elements is a second thin film transistor element 20. The second thin film transistor element 20 (i) includes an amorphous silicon hydride semiconductor (a-Si:H) as a channel layer 21 and (ii) has a circuit role different from that of the oxide TFT 10. Hereinafter, the second thin film transistor element 20 is referred to as "a-Si TFT 20".

A material, from which the channel layer 21 is made, is not limited to the amorphous silicon semiconductor. Alternatively, (i) a microcrystalline silicon semiconductor (μc-Si) or (ii) a stacking semiconductor in which a-Si:H and μc-Si are stacked can be employed. The stacking semiconductor covers a wavelength band of light which cannot be completely covered by a single layer. This makes it possible to form an optical sensor element which is highly sensitive to a wide wavelength band.

Note that configurations of the oxide TFT 10 and the a-Si TFT 20 will be described later in detail.

With the configuration, the oxide TFT 10 can provide a high output voltage without being made larger in size (because the oxide TFT 10 has a mobility of approximately 20 times greater than that of the a-Si TFT 20). This causes the oxide TFT 10 to have a first characteristic that a decrease in aperture ratio of a pixel can be suppressed whereas a sensitivity of light (in particular, visible light) is low. On the other hand, the a-Si TFT 20 has a second characteristic that a sensitivity of light is high whereas an output voltage is low because of a low mobility.

As such, the oxide TFT 10 having the first characteristic and the a-Si TFT 20 having the second characteristic can play different circuit roles. This makes it possible to provide a high performance circuit board 1 which includes electric circuits in which different circuit roles are put to good use.

(Application Example of Circuit Board—Optical Sensor Circuit)

Figure 3:
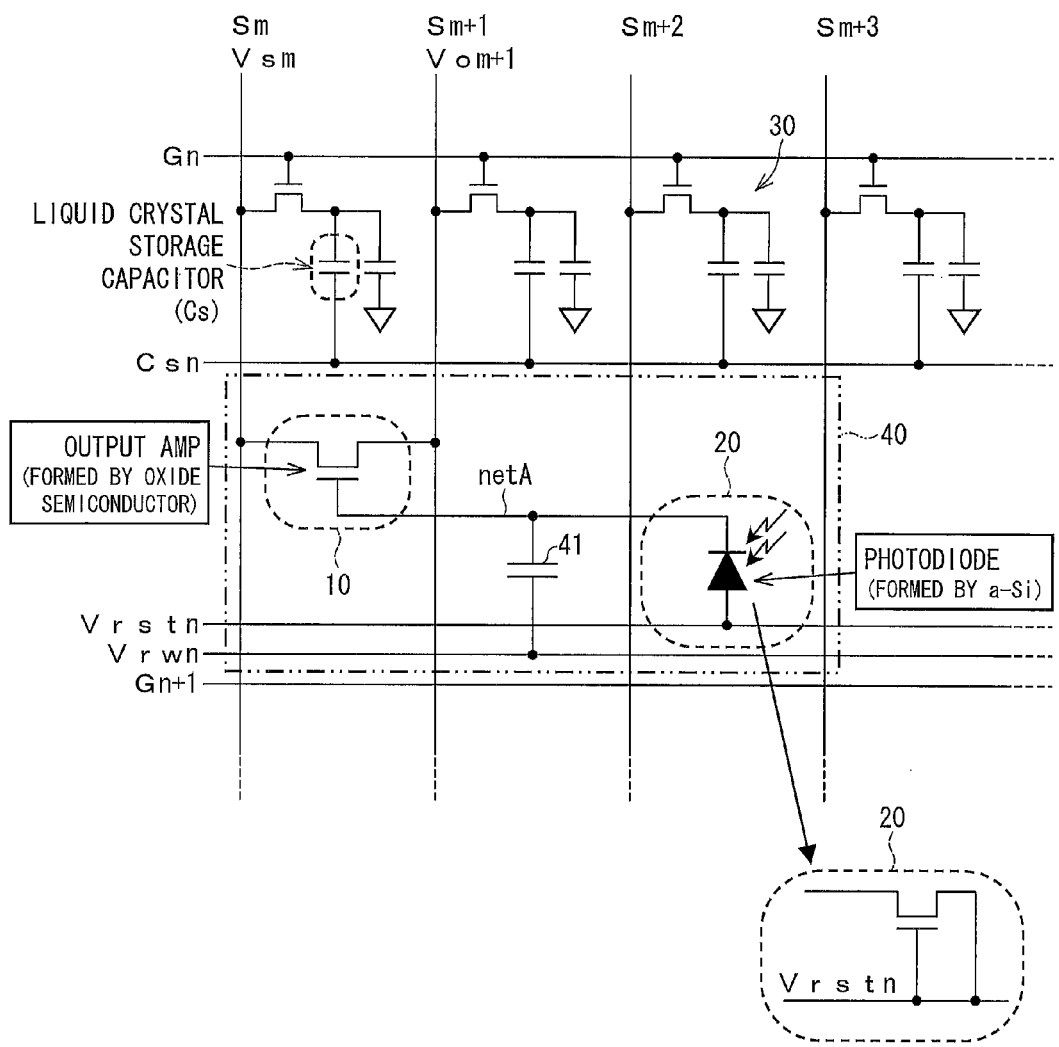
FIG. 3 is a circuit diagram illustrating a circuit configuration of a plurality of pixels and an optical sensor circuit formed on an active matrix substrate of a liquid crystal display device.

FIG. 3 illustrates an application of the circuit board 1. FIG. 3 is a circuit diagram illustrating a circuit configuration of a plurality of pixels 30 and an optical sensor circuit 40 formed on an active matrix substrate of a liquid crystal display device. The active matrix substrate corresponds to the circuit board 1. In FIG. 3, the basic configuration of the circuit board 1 is applied to the optical sensor circuit 40.

Note that FIG. 3 illustrates a circuit configuration formed in an area indicated by Sa in a display panel 51 of a liquid crystal display device 50 (later described with reference to FIG. 4).

The optical sensor circuit 40 is first schematically described. The optical sensor circuit 40 includes the oxide TFT 10 and the a-Si TFT 20 (see FIG. 3). The oxide TFT 10 serves as a sensor output section (output amplifier) of the optical sensor circuit 40, and the a-Si TFT 20 serves as an optical sensor element of the optical sensor circuit 40.

Specifically, the optical sensor circuit 40 is configured as a 1T ("T" is an abbreviation of "transistor") circuit in which only a single transistor that plays the role of a sensor output section is employed. The oxide TFT 10 serves as a source follower transistor (voltage follower transistor). The oxide TFT 10 has (i) a drain which is connected with an AMP power supply bus line Vsm (m is a natural number indicative of a pixel column number) and (ii) a source which is connected with an optical sensor output bus line Vom+1. The AMP power supply bus line Vsm and the optical sensor output bus line Vom+1 are connected with a sensor readout circuit 55 (see FIG. 4). The sensor readout circuit 55 applies a power supply voltage VDD to the AMP power supply bus line Vsm.

The oxide TFT 10 has a base connected with (i) a source of the a-Si TFT 20 which serves as a photodiode and (ii) an end of a step-up capacitor 41.

A drain electrode 26 and a gate electrode 22 (base) of the a-Si TFT 20 are short-circuited (see FIG. 1). Since the a-Si TFT 20 has a diode-connection configuration, the a-Si TFT 20 serves as a photodiode whose cathode and anode are a source electrode 25 and the drain electrode 26, respectively (see FIG. 3).

Figure 4:
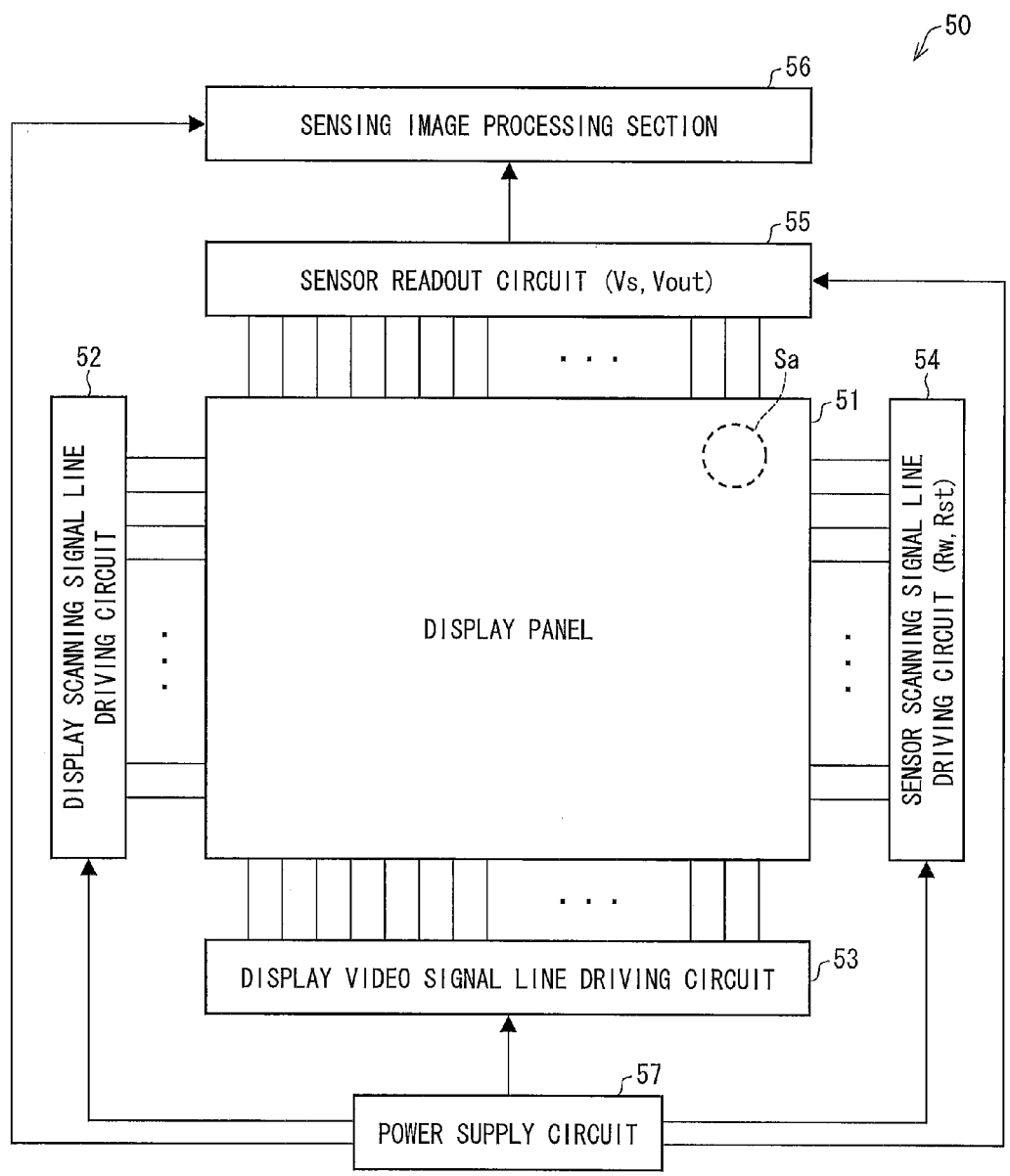
FIG. 4 is a block diagram schematically illustrating a configuration of a liquid crystal display device.

The drain of the a-Si TFT 20 is further connected with a photodiode reset line Vrstn (n is a natural number indicative of a pixel row number), to which a resetting signal RST is supplied from a sensor scanning signal line driving circuit 54 (see FIG. 4). Another end of the step-up capacitor 41 is connected with an optical sensor row selection line Vrwn to which an optical sensor row selecting signal RWS is supplied. Note that the optical sensor row selecting signal RWS is used to select a certain row of optical sensor circuits, which are arranged in a matrix manner, so that each detection signal is outputted from a corresponding one of the optical sensor circuits 40 provided in the certain row.

With the configuration, the oxide TFT 10 can provide a high output voltage without being made larger in size. This causes the oxide TFT 10 to have the first characteristic that a decrease in aperture ratio of a pixel can be suppressed whereas a sensitivity of light is low. The oxide TFT 10 is therefore suitable for serving as the sensor output section in the optical sensor circuit 40.

On the other hand, the a-Si TFT 20 has the second characteristic that a sensitivity of light is high whereas an output voltage is low because of a low mobility. The a-Si TFT 20 is therefore suitable for serving as the optical sensor element in the optical sensor circuit 40. Note that the optical sensor element is required to have a sensitivity to light in any of an ultraviolet range, a visible light range, and an infrared range. a-Si:H has a good sensitivity over a substantially entire range of the visible light so as to have a sensitivity peak around 500 nm to 600 nm.

This allows the oxide TFT 10 and the a-Si TFT 20 to constitute the optical sensor circuit 40 which has excellent advantages of (i) suppressing a decrease in aperture ratio of a pixel, (ii) having a high sensitivity, and (iii) having a high response speed. The same applies to a case where (i) µc-Si or (ii) a stacking semiconductor in which a-Si:H and µc-Si are stacked is employed as the channel layer 21 of the a-Si TFT 20.

Note that such excellent advantages of the optical sensor circuit 40 will have a significant beneficial consequence in a case where, for example, a plurality of optical sensor circuits 40 are provided in an active matrix substrate, in which pixels using liquid crystal are arranged in a matrix manner, so that a liquid crystal display device is designed to have a function such as a touch panel function or an image scanning function.

Note that how the optical sensor circuit 40 operates will be described later.

(Configuration of Pixel)

The following known elements for constituting pixels 30 are further provided above the circuit board 1 in which the optical sensor circuit 40 is provided. Specifically, gate lines Gn and source lines Sm are provided so as to be arranged in a matrix manner, and elements such as (i) switching elements for driving the respective pixels 30, (ii) pixel electrodes for forming liquid crystal capacitors, and (iii) auxiliary capacitors are provided for respective intersections of the gate lines Gn and the source lines Sm (see FIG. 3). Each of the auxiliary capacitors of the respective pixels 30 is connected with a corresponding auxiliary capacitor line Csn.

The optical sensor circuits 40 can be provided (i) for the respective pixels 30 or (ii) for respective predetermined number of pixels 30 belonging to a group. The number of the optical sensor circuits 40 can be determined by taking into consideration a resolution required for a light detection.

In the example configuration illustrated in FIG. 3, one (1) optical sensor circuit 40 is provided for three pixels 30. Three colors of R (red), G (green), and B (blue) can be allocated as the respective three pixels 30 so as to carry out a full-color display.

Note that the source line Sm serves also as the AMP power supply bus line Vsm, and a source line Sm+1, which is adjacent to the source line Sm, serves also as the optical sensor output bus line Vom+1.

(Detailed Example Configuration 1 of TFT)

In Embodiment 1, each of the oxide TFT 10 and the a-Si TFT 20 is configured so as to be a bottom-gate transistor (see FIG. 1).

Specifically, the oxide TFT 10 has a gate electrode 12 serving as a bottom gate. The gate electrode 12 is covered with a first gate insulating film (first insulating layer) 3 whose main component is $SiO_2$. The channel layer 11 is deposited on the first gate insulating film 3, and an etching stopper 14 whose main component is $SiO_2$ is stacked on the channel layer 11.

A source electrode 15 is further provided so as to (i) extend from an upper surface of the first gate insulating film 3 to an upper surface of the etching stopper 14 and (ii) cover lateral surfaces, on a source side, of respective of the channel layer 11 and the etching stopper 14. Similarly, a drain electrode 16 is provided so as to (i) extend from an upper surface of the first gate insulating film 3 to an upper surface of the etching stopper 14 and (ii) cover lateral surfaces, on a drain side, of respective of the channel layer 11 and the etching stopper 14.

The a-Si TFT 20 has a gate electrode 22 serving as a bottom gate, as with the oxide TFT 10. The gate electrode 22 is covered with the first gate insulating film 3 which is shared with the oxide TFT 10. Note, however, that, in the a-Si TFT 20, a second gate insulating film (second insulating layer) 23 whose main component is $SiN_x$ is locally deposited on the first gate insulating film 3, and a channel layer 21 is deposited on the second gate insulating film 23. A conductive layer 24 is stacked on the channel layer 21 on a source side and on a drain, separately. $n^+$a-Si or $n^+$µc-Si which is doped with an n-type impurity in a relatively high concentration can be employed as the conductive layer 24.

A source electrode 25 is provided so as to (i) extend from an upper surface of the first gate insulating film 3 to a source-side upper surface of the conductive layer 24 and (ii) cover lateral surfaces, on the source side, of respective of the second gate insulating film 23, the channel layer 21, and the conductive layer 24. Similarly, a drain electrode 26 is provided so as to (i) extend from an upper surface of the first gate insulating film 3 to a drain-side upper surface of the conductive layer 24 and (ii) cover lateral surfaces, on the drain side, of respective of the second gate insulating film 23, the channel layer 21, and the conductive layer 24.

The oxide TFT 10 and the a-Si TFT 20 are covered with and protected by a passivation film 4 whose main component is $SiN_x$.

Note that the drain electrode 26 and the gate electrode 22 of the a-Si TFT 20 are short-circuited via a through hole formed in the first gate insulating film 3.

(Detailed Example Configuration 2 of TFT)

As described in Detailed Example Configuration 1, in the case of the oxide TFT 10 and the a-Si TFT 20, the a-Si TFT 20 has a configuration of two-layer insulating films, i.e., the first gate insulating film 3 and the second gate insulating film 23.

Note, however, that, contrary to the configuration illustrated in FIG. 1, the oxide TFT 10 can have a configuration of two-layer insulating films, by employing a first gate insulating film 3 whose main component is $SiN_x$ instead of $SiO_2$.

Figure 2:
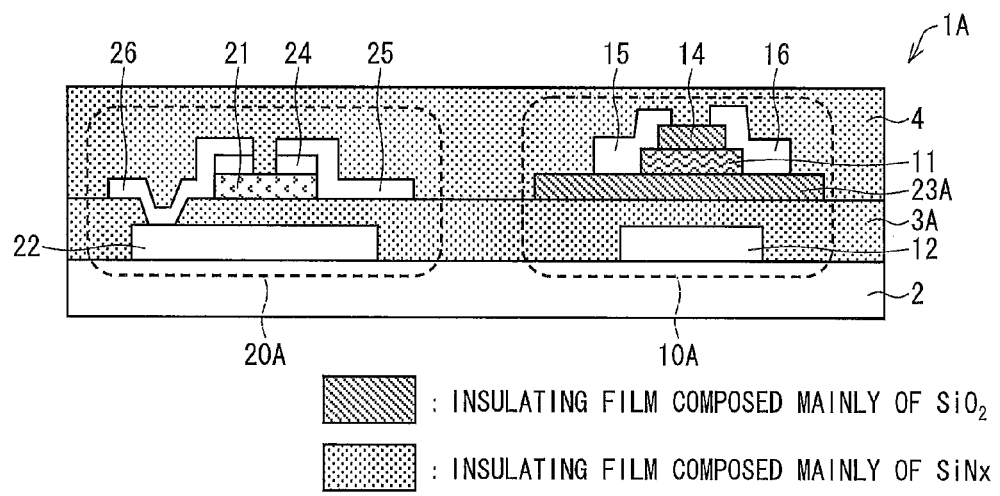
FIG. 2 is a cross sectional view schematically illustrating a modification of the basic configuration of the circuit board illustrated in FIG. 1.

A specific configuration is illustrated in FIG. 2. FIG. 2 is a cross sectional view schematically illustrating a modification of the basic configuration of the circuit board illustrated in FIG. 1. Note that identical reference numerals are given to constituent members identical with those illustrated in FIG. 1, and detailed descriptions of such constituent members are omitted here.

A circuit board 1A includes an oxide TFT 10A and an a-Si TFT 20A which are both configured so as to be respective bottom-gate transistors (see FIG. 2).

Specifically, the oxide TFT 10A has a gate electrode 12 serving as a bottom gate. The gate electrode 12 is covered with a first gate insulating film (first insulating layer) 3A whose main component is $SiN_x$. A second gate insulating film (second insulating layer) 23A whose main component is $SiO_2$ is locally deposited on the first gate insulating film 3, and a channel layer 11 and an etching stopper 14 are deposited in this order on the second gate insulating film 23A. A source electrode 15 and a drain electrode 16 of the oxide TFT 10A are basically identical with those illustrated in FIG. 1, except that the source electrode 15 and the drain electrode 16 of the oxide TFT 10A are provided on the second gate insulating film 23A.

On the other hand, the a-Si TFT 20A has a gate electrode 22 serving as a bottom gate, as with the oxide TFT 10A. The gate electrode 22 is covered with the first gate insulating film 3A which is shared with the oxide TFT 10A. The other configurations of the a-Si TFT 20A are basically identical with those of the a-Si TFT 20 illustrated in FIG. 1, except that the second gate insulating film 23 is not provided in the a-Si TFT 20A.

Moreover, the oxide TFT 10A and the a-Si TFT 20A are covered with and protected by a passivation film 4 composed mainly of $SiN_x$, as with the configuration illustrated in FIG. 1.

Note that the drain electrode 26 and the gate electrode 22 of the a-Si TFT 20A are short-circuited via a through hole formed in the first gate insulating film 3A.

(Merit 1 Brought about by Configuration of TFT)

The oxide TFT 10(A) and the a-Si TFT 20(A) are thus respective bottom-gate transistors. As such, the gate electrodes 12 and 22 can block light emitted from the backlight, in a case where the circuit board 1(A) is provided in, for example, a display device (i) which includes a backlight and (ii) in which intensity of light emitted by the backlight is modulated by the pixels 30. This particularly brings about an effect of preventing a deterioration in characteristic of the oxide TFT 10 or 10A without separately providing a light-shielding film.

It is further possible to bring about an effect of blocking, by the gate electrodes 12 and 22, the light emitted from the backlight which light will cause noise during sensing by the use of the a-Si TFT 20 or 20A.

Since it is thus unnecessary to separately provide a light-shielding layer, it is possible to fully demonstrate, at low cost, a performance of a circuit board which includes a plurality of thin film transistor elements formed by different types of semiconductors.

(Merit 2 Brought About by Configuration of TFT)

The gate electrode 12 and the gate electrode 22 are formed by a single conductive layer (by patterning a single conductive layer), and the source electrodes 15 and 25 and the drain electrodes 16 and 26 are formed by a single conductive layer (by patterning a single conductive layer). Note that how to manufacture the circuit board 1 and 1A will be described later in detail.

This brings about significant effects as follows: that is, in a case where the circuit board 1 or 1A is provided in a display device having a backlight, it is possible to (i) simplify manufacturing processes and (ii) reduce cost, without deteriorating the excellent merits, i.e., (a) suppression of a decrease in aperture ratio of a pixel 30, (b) a high sensitivity, and (c) a high response speed.

(Merit 3 Brought About by Configuration of TFT)

As early described, according to the circuit board 1, the channel layer 11 of the oxide TFT 10 is provided between the first gate insulating film 3 whose main component is oxide $SiO_2$ and the etching stopper 14 whose main component is $SiO_2$.

On the other hand, the a-Si TFT 20 has the two-layer configuration formed by use of $SiN_x$ and $SiO_2$. As such, the channel layer 21 of the a-Si TFT 20 is provided between the second gate insulating film 23 whose main component is nitride $SiN_x$ and the passivation film 4 whose main component is $SiN_x$.

According to the circuit board 1A, the oxide TFT 10 has the two-layer configuration formed by use of $SiO_2$ and $SiN_x$. As such, the channel layer 11 of the oxide TFT 10 is provided between the second gate insulating film 23A whose main component is oxide $SiO_2$ and the etching stopper 14 whose main component is $SiO_2$.

On the other hand, the channel layer 21 of the a-Si TFT 20A is provided between the first gate insulating film 3A whose main component is nitride $SiN_x$ and the passivation film 4 whose main component is $SiN_x$.

The first gate insulating film 3 is formed as a single layer shared by the oxide TFT 10 and the a-Si TFT 20, and the first gate insulating film 3A is formed as a single layer shared by the oxide TFT 10A and the a-Si TFT 20A.

This allows the oxide semiconductor constituting the channel layer 11 and the amorphous silicon semiconductor constituting the channel layer 21 to be in contact with an appropriate gate insulating film or a passivation film.

In a case where a reducing material/agent (here, a-Si hydride constituting the channel layer 21 and $SiN_x$ constituting the passivation film 4) makes contact with an oxide semiconductor, the oxide semiconductor is deoxidized and therefore a characteristic of the oxide semiconductor is deteriorated. However, according to the configuration of Embodiment 1, such a deterioration in characteristic can be prevented because an oxide makes contact with the oxide semiconductor.

In a case where an oxide makes contact with an amorphous silicon semiconductor or a microcrystalline silicon semiconductor, the amorphous silicon semiconductor or the microcrystalline silicon semiconductor is oxidized, and therefore a characteristic of the amorphous silicon semiconductor or the microcrystalline silicon semiconductor is deteriorated. However, according to the configuration of Embodiment 1, such a deterioration in characteristic can be prevented because a reducing material/agent makes contact with the amorphous silicon semiconductor or the microcrystalline silicon semiconductor.

In addition, since the first gate insulating film 3 or 3A is formed as a single layer, it is possible to further (i) simplify manufacturing processes and (ii) reduce cost.

(Configuration of Display Device)

The following description will discuss a schematic configuration of a liquid crystal display device 50, as an example of a display device including the circuit board 1 or 1A.

FIG. 4 is a block diagram schematically illustrating a configuration of the liquid crystal display device 50. The liquid crystal display device 50 includes a display panel 51, a display scanning signal line driving circuit 52, a display video signal line driving circuit 53, a sensor scanning signal line driving circuit 54, a sensor readout circuit 55, a sensing image processing section 56, and a power supply circuit 57 (see FIG. 4).

The display panel 51 includes an active matrix substrate and a counter substrate between which a liquid crystal layer is provided and sealed. The insulating substrate 2 illustrated in FIG. 1 is a base member of the active matrix substrate. Examples of the base member encompass a glass substrate. The display scanning signal line driving circuit 52, the display video signal line driving circuit 53, the sensor scanning signal line driving circuit 54, and the sensor readout circuit 55 can be provided by separate LSI provided on the display panel 51. Alternatively, the display scanning signal line driving circuit 52, the display video signal line driving circuit 53, the sensor scanning signal line driving circuit 54, and the sensor readout circuit 55 can be monolithically formed on the insulating substrate 2.

The wording "monolithically formed" (i) means that circuit elements are formed directly on the insulating substrate 2 by at least one of a physical process and a chemical process but (ii) does not mean that a semiconductor circuit is provided as a module on the glass substrate.

In a case where the liquid crystal display device 50 is a VA (Vertical Alignment) mode liquid crystal display device, a common electrode and color filters of R (red), G (green), and B (blue) are provided in a counter substrate. Note that the present invention is not restricted by a liquid crystal mode. Therefore, the present invention is applicable to a TN (Twisted Nematic) mode or to an IPS (In-Plane Switching) mode which is called a horizontal electric field application mode in which a common electrode is provided on an active matrix substrate.

The display scanning signal line driving circuit 52 generates scanning signals for selectively scanning pixels 30 row by row via gate lines Gn. The display video signal line driving circuit 53 supplies video signals to pixels 30 via source lines Sm.

The sensor scanning signal line driving circuit 54 selects and drives optical sensor circuits 40 row by row. The sensor readout circuit 55 (i) supplies the power supply voltage VDD having a constant electric potential to optical sensor circuits 40 via the AMP power supply bus line Vsm and (ii) reads out light detection signals from the optical sensor circuits 40 via the optical sensor output bus line Vom+1.

The sensing image processing section 56 (i) is configured by components such as an LSI (Large Scale integrated Circuit) and a PC (Programmable Controller) and (ii) executes a stored image processing program so as to generate (a) a scanned image of a document and/or (b) information such as a location of a finger or a pointing pen with respect to the display panel 2, from a light detection signal supplied from an optical sensor circuit 40.

The power supply circuit 57 supplies power supply voltages which are needed for respective of the display scanning signal line driving circuit 52, the display video signal line driving circuit 53, the sensor scanning signal line driving circuit 54, the sensor readout circuit 55, and the sensing image processing section 56.

Note that the configuration of the liquid crystal display device 50 is not limited to the described one. Alternatively, another circuit, such as the display scanning signal line driving circuit 52 or the display video signal line driving circuit 53, can have the functions of the sensor scanning signal line driving circuit 54 and the sensor readout circuit 55. Similarly, the sensing image processing section 56 can alternatively have the function of the sensor readout circuit 55.

(Operation of Optical Sensor Circuit: Bright State)

Figure 5:
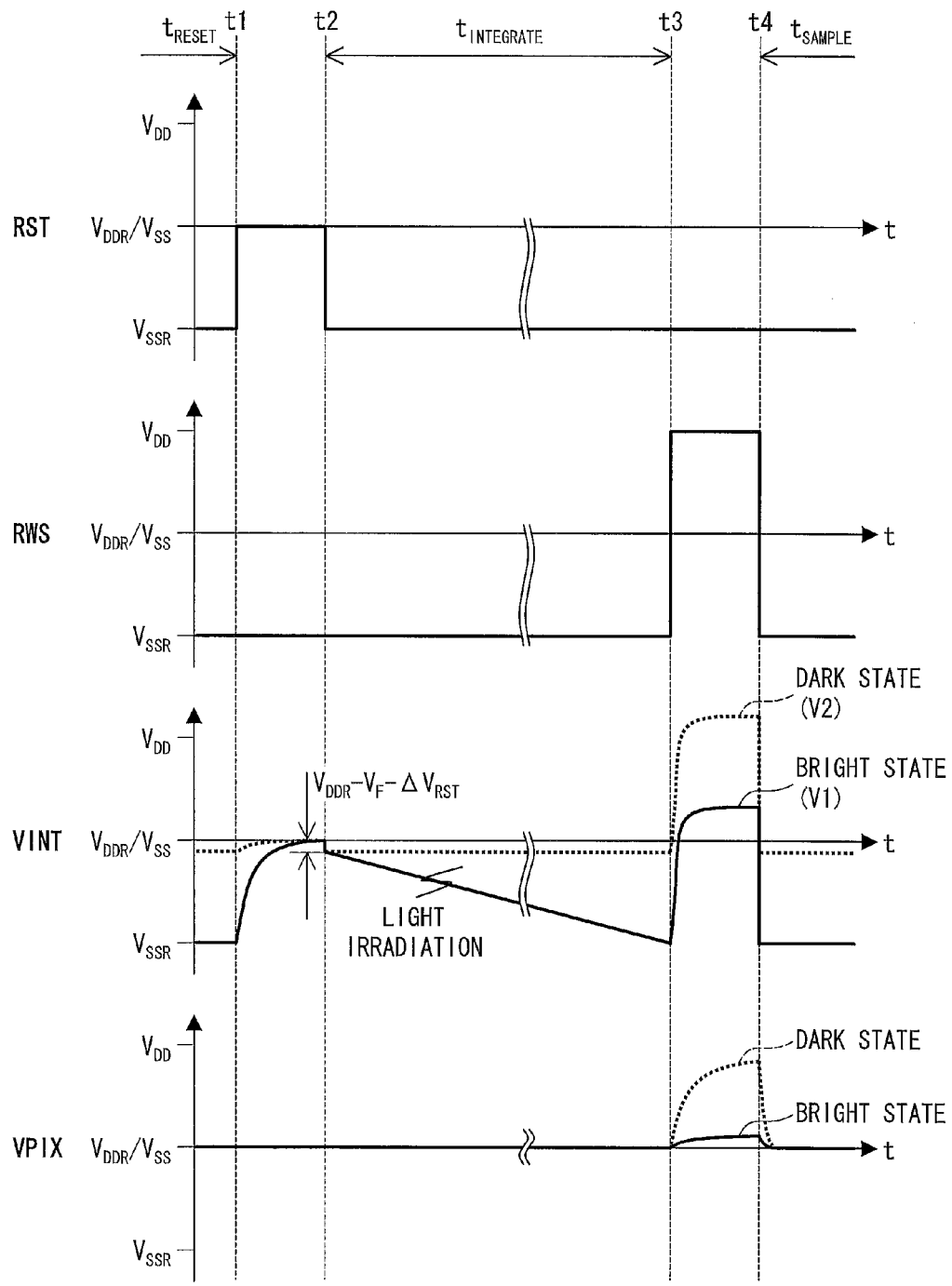
FIG. 5 is a timing chart illustrating an operation of the optical sensor circuit.

The following description will discuss how the optical sensor circuit 40 operates, with reference to FIG. 5. FIG. 5 is a timing chart illustrating how the optical sensor circuit 40 operates. In the following description, an optical sensor circuit 40 having an oxide TFT 10 and an a-Si TFT 20 will be described. Note, however, that an optical sensor circuit 40 having an oxide TFT 10A and an a-Si TFT 20A operates similarly.

First, in order to reset a base electric potential VINT of the oxide TFT 10, a resetting signal RST having a High level is supplied from the sensor scanning signal line driving circuit 54 to a photodiode reset line Vrstn. This causes the a-Si TFT 20, which serves as a photodiode, to be forward-biased during a reset period (from t1 to t2). Consequently, since the step-up capacitor 41 is charged, the base electric potential VINT gradually increases and ultimately reaches an initialization electric potential ($V_{DDR}$).

When the resetting signal RST is decreased to a Low level after the base electric potential VINT reaches the initialization electric potential, a cathode electric potential of the a-Si TFT 20 (i.e., an electric potential of a connection part netA between a base of the oxide TFT 10 and a source of the a-Si TFT 20) becomes higher than an anode electric potential. This causes the a-Si TFT 20 to be reverse-biased. The base electric potential VINT at the time is equal to an electric potential obtained by subtracting, from the initialization electric potential ($V_{DDR}$), a forward voltage drop ($V_F$) in the a-Si TFT 20 and a voltage drop ($\Delta V_{RST}$) caused by a parasitic capacitance of the a-Si TFT 20.

During a light detection period (from t2 to t3) in which the a-Si TFT 20 is irradiated with light while the a-Si TFT 20 is being reverse-biased, a photoelectric current, which (i) is caused by reverse-biasing the a-Si TFT 20 and (ii) varies depending on intensity of light, is being flown through the a-Si TFT 20. As a result, an electric charge, stored by the step-up capacitor 41, is discharged via the photodiode reset line Vrstn. This causes the base electric potential VINT to be gradually decreased and then ultimately decreased to a detection electric potential which varies depending on the intensity of light with which the a-Si TFT 20 is irradiated.

Note that, as the photoelectric current caused by the reverse-biasing becomes larger, the optical sensor element has a higher sensitivity.

Subsequently to the light detection period, after elapse of a period of reading a light detection result, that is, a detection signal reading period (from t3 to t4), a row selection signal RWS of a High level, which is supplied from the sensor scanning signal line driving circuit 54, is applied to the another end of the step-up capacitor 41 via the optical sensor row selection line Vrwn. This causes the base electric potential VINT to be boosted up via the step-up capacitor 41, and therefore the base electric potential VINT is changed to have an electric potential (e.g., an electric potential V1 in FIG. 5) which is equivalent to an electric potential obtained by adding a High level electric potential of the row selection signal RWS to the detection electric potential.

Note that the electric potential V1 illustrated in FIG. 5 corresponds to a bright state obtained when the a-Si TFT 20 receives strong light and the base electric potential VINT drops to a lowest level at t3.

When the base electric potential VINT is boosted up, it exceeds a threshold voltage at which the oxide TFT 10 is turned ON, and therefore the oxide TFT 10 becomes in an ON state. Consequently, a voltage, which has been amplified with an amplification factor that varies depending on a level of the base electric potential VINT, i.e., intensity of the light with which the a-Si TFT 20 is irradiated, (i) is outputted as a detection signal (e.g., a detection signal VPIX in a bright state illustrated in FIG. 5) from the source of the oxide TFT 10 and (ii) is then supplied to the sensor readout circuit via the optical sensor output bus line Vom+1.

(Operation of Optical Sensor Circuit: Dark State)

On the other hand, in a case where the a-Si TFT 20 is not irradiated with light during the light detection period (from t2 to t3), no photoelectric current is flown through the a-Si TFT 20. This causes the base electric potential VINT to be substantially maintained at the initialization electric potential. In practice, the base electric potential VINT becomes a detection electric potential slightly lower than the initialization electric potential, because a leakage current slightly flows.

During the following detection signal reading period (from t3 to t4), the base electric potential VINT is boosted up via the step-up capacitor 41 as with the bright state, and therefore the base electric potential VINT is changed to have an electric potential (e.g., an electric potential V2 in FIG. 5) which is substantially equivalent to an electric potential obtained by adding a High level electric potential of the row selection signal RWS to the initialization electric potential.

At the time, a detection signal (e.g., a detection signal VPIX in a dark state illustrated in FIG. 5) outputted from the oxide TFT 10 rises to a maximum level.

A detection signal having a level, which varies depending on intensity of light with which the a-Si TFT 20 is irradiated, is generated in a pixel 30 which corresponds to the optical sensor circuit 40. According to the configuration, it is possible to carry out a detection operation (such as a reading of coordinates on the display panel 51, a reading of a character, or a reading of a fingerprint) with respect to an object to be detected in the vicinity of the display panel 51, by utilizing light of the backlight which is provided, as a light source for display-use, in the liquid crystal display device 50 illustrated in FIG. 4.

Note that the optical sensor circuit 40 is configured by elements, which are very fewer than those constituting a conventional CMOS optical sensor circuit. This causes a reduction in area occupied by the optical sensor circuit 40. Therefore, the optical sensor circuit 40 of 1T type is very beneficial to an increase in aperture ratio of a pixel 30. Moreover, as the number of the elements becomes smaller, a self-parasitic capacitance of the optical sensor circuit 40 becomes smaller. This allows (i) an increase in response speed of a detection operation and (ii) an alleviation of a problem that a dynamic range is reduced by a feed-through voltage caused by parasitic capacitance.

(Method for Manufacturing Circuit Board Part 1)

Figure 6:
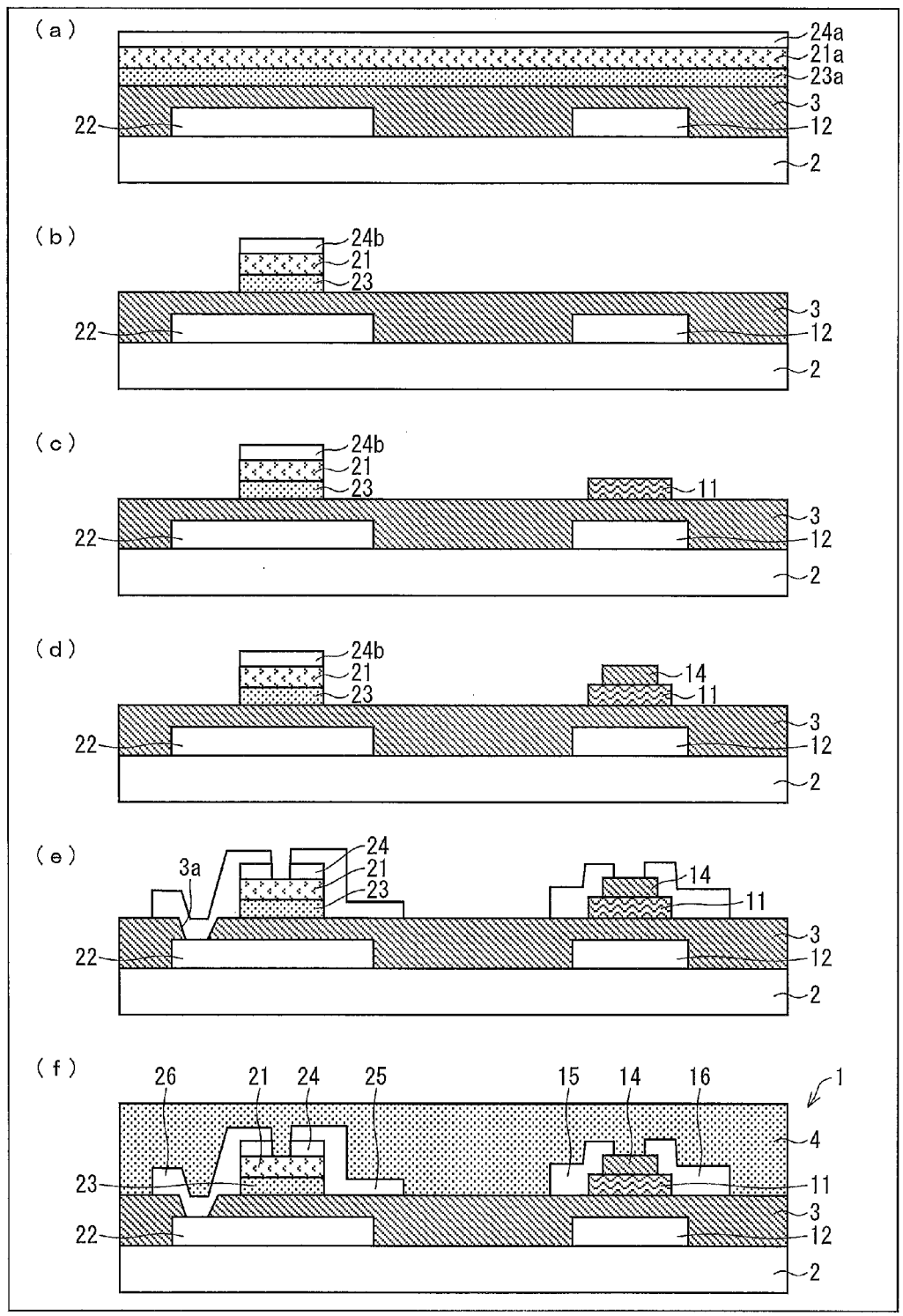
FIG. 6 is a process chart sequentially illustrating manufacturing processes of the circuit board illustrated in FIG. 1.

The following description will discuss a method for manufacturing the circuit board 1, while focusing on a simplification of manufacturing processes. FIG. 6 is a process chart sequentially illustrating processes for manufacturing a circuit board 1.

The method of Embodiment 1 for manufacturing a circuit board is a method for forming, on an insulating substrate 2, an oxide TFT 10 and an a-Si TFT 20 which have different circuit roles because channel layers 11 and 21 are formed by different types of semiconductors, as early described with reference to FIG. 1.

Gate electrodes 12 and 22 of respective of the oxide TFT and the a-Si TFT 20 are concurrently formed by patterning a single conductive layer formed on the insulating substrate 2 (step A) (see (a) of FIG. 6). This step A corresponds to a step (1) recited in claims.

Then, a first gate insulating film 3, whose main component is $SiO_2$ that is an insulating material suitable for (i.e., does not deteriorate) an oxide semiconductor, is formed over the gate electrodes 12 and 22 (step B).

Subsequently, a second insulating film 23a, whose main component is $SiN_x$ that is an insulating material suitable for an amorphous silicon semiconductor (i.e., does not deteriorate an amorphous silicon semiconductor), is deposited on the first gate insulating film 3 in a location corresponding to a location in which the channel layer 21 of the a-Si TFT 20 is formed (step C). Then, an a-Si film 21a and a conductive film 24a are stacked on the second insulating film 23a in this order (step D). The conductive film 24a is an $n^+$a-Si film or an $n^+\mu c$-Si film to which an n-type impurity is added at a relatively high concentration.

Then, the second insulating film 23a, the a-Si film 21a, and the conductive film 24a are, in all, subjected to a patterning (step E) so that a second gate insulating film 23, a channel layer 21, and a conductive layer 24b of the a-Si TFT 20 are formed (step F) (see (b) of FIG. 6). Note that a conductive layer 24 is formed from the conductive layer 24b.

Note that the steps B, C, E, and F correspond to a step (2) recited in claims.

An oxide semiconductor is deposited and patterned on the first gate insulating film 3 so that a channel layer 11 of the oxide TFT 10 is formed (step G) (see (c) of FIG. 6).

Subsequently, a film whose main component is $SiO_2$ is deposited and patterned on the channel layer 11 so that an etching stopper 14 is formed (step H) (see (d) of FIG. 6).

Next, the gate electrode 22 is locally exposed by forming a contact hole 3a in the first gate insulating film 3 (step I) so that the a-Si TFT 20 becomes a diode-connected transistor (see (e) of FIG. 6).

Then, a conductive layer is deposited overall and is then patterned so that (i) a source electrode 15 and a drain electrode 16 of the oxide TFT 10 and (ii) a source electrode and a drain electrode 26 of the a-Si TFT 20 are concurrently formed by the (single) conductive layer (step J). Subsequently, a gap is formed in the conductive layer 24b by etching the conductive layer 24b while the source electrode 25 and the drain electrode 26 are being used as mask, and a conductive layer 24 is thus formed (step K). Note that the step J corresponds to a step (3) recited in claims.

Lastly, a passivation film 4 is formed so as to cover overall (step L), and a circuit board 1 is thus prepared (see (f) of FIG. 6).

As above described, according to the method of Embodiment 1 for manufacturing a circuit board, (i) the first gate insulating film 3 is concurrently formed as a single layer shared by the oxide TFT 10 and the a-Si TFT 20 and then (ii) the second insulating film 23a composed mainly of $SiN_x$ is formed so that the a-Si TFT 20 has two gate insulating films composed mainly of respective $SiO_2$ and $SiN_x$. This makes it possible to (i) prevent manufacturing processes from being complicated, that is, simplify the manufacturing processes and (ii) reduce cost.

Moreover, the gate electrodes 11 and 22 of respective of the oxide TFT 10 and the a-Si TFT 20 are formed by a single conductive layer, and the source electrodes 15 and 25 and the drain electrodes 16 and 26 are also formed by a single conductive layer. This allows (i) a further simplification of manufacturing processes and (ii) a further reduction in cost.

(Method for Manufacturing Circuit Board Part 2)

Figure 7:
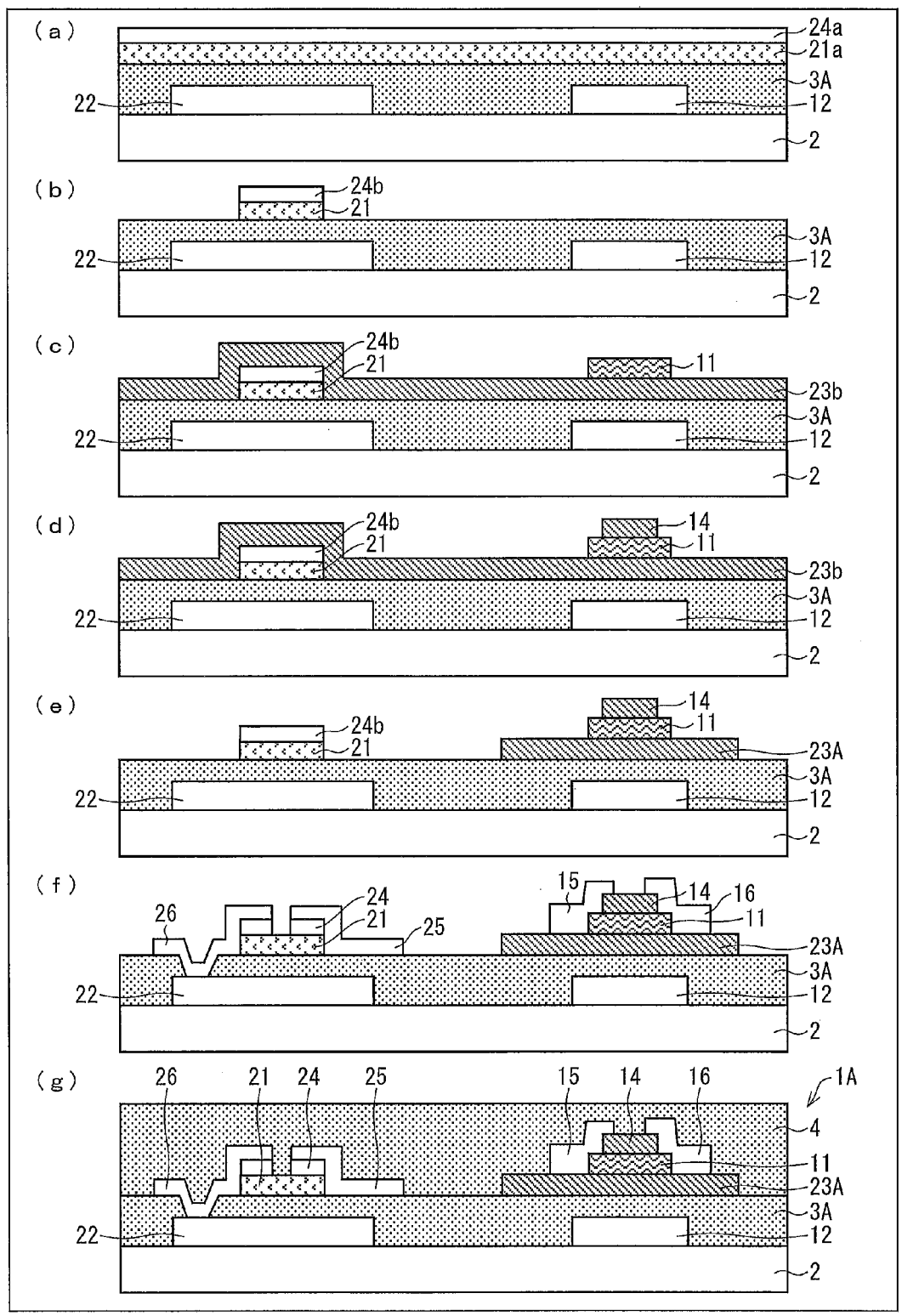
FIG. 7 is a process chart sequentially illustrating manufacturing processes of the circuit board illustrated in FIG. 2.

The following description will discuss a method for manufacturing the circuit board 1A illustrated in FIG. 2, while focusing on a difference from the method for manufacturing the circuit board 1. FIG. 7 is a process chart sequentially illustrating processes for manufacturing a circuit board 1A.

Gate electrodes 12 and 22 are concurrently formed on an insulating substrate 2 (step A) (see (a) of FIG. 7), in a manner identical with the method for manufacturing the circuit board 1.

Then, a first gate insulating film 3A, whose main component is $SiN_x$ that is an insulating material suitable for (i.e., does not deteriorate) an amorphous silicon semiconductor, is formed over the gate electrodes 12 and 22 (step B').

Subsequently, an a-Si film 21a and a conductive film 24a are stacked on the first gate insulating film 3A in this order (step C'). The conductive film 24a is made of an n$^+$a-Si film or an n$^+$μc-Si film to which an n-type impurity is added at a relatively high concentration.

Then, the a-Si film 21a and the conductive film 24a are, in all, subjected to a patterning (step D') so that a channel layer 21 and a conductive layer 24b of an a-Si TFT 20A are formed (step E') (see (b) of FIG. 7). Note that a conductive layer 24 is formed form the conductive layer 24b.

Subsequently, a second insulating film 23a, whose main component is $SiO_2$ that is an insulating material suitable for an oxide semiconductor (i.e., does not deteriorate an oxide semiconductor), is deposited on the first gate insulating film 3A (step F') (see (c) of FIG. 7). Then, an oxide semiconductor is deposited and patterned on the second insulating film 23b so that a channel layer 11 of an oxide TFT 10A is formed (step G').

Subsequently, a film whose main component is $SiO_2$ is deposited and patterned on the channel layer 11 so that an etching stopper 14 is formed (step H') (see (d) of FIG. 7).

Then, a second gate insulating film 23A is locally formed between (i) the channel layer 11 of the oxide TFT 10A and (ii) the first gate insulating film 3A, by eliminating the second insulating film 23b on the a-Si TFT 20A with the use of, for example, a photolithographic method (step I') (see (e) of FIG. 7).

Note that the steps B', F', and I' correspond to the step (2) recited in claims.

The other steps, that is, (i) a step of forming a diode connection of the a-Si TFT 20A, (ii) a step of concurrently forming (a) a source electrode 15 and a drain electrode 16 of the oxide TFT 10A and (b) a source electrode 25 and a drain electrode 26 of the a-Si TFT 20A from a single conductive layer, (iii) a step of forming a conductive layer 24 of the a-Si TFT 20A (these steps (i) through (iii) are illustrated in (f) of FIG. 7), and (iv) a step of forming a passivation film 4 (see (g) of FIG. 7), are identical with those early described with reference to FIG. 6. The circuit board 1A is thus prepared.

As above described, according to the method of Embodiment 1 for manufacturing a circuit board, (i) the first gate insulating film 3 is formed as a single layer shared by the oxide TFT 10 and the a-Si TFT 20 and then (ii) the second gate insulating film 23A whose main component is $SiO_2$ is formed so that the oxide TFT 10A has the two-layer configuration, i.e., a gate insulating film whose main component is $SiN_x$ and a gate insulating film whose main component is $SiO_2$. This makes it possible to (i) prevent manufacturing processes from being complicated, that is, simplify the manufacturing processes and (ii) reduce cost.

Moreover, the gate electrodes 11 and 22 of respective of the oxide TFT 10A and the a-Si TFT 20A are formed by a single conductive layer, and the source electrodes 15 and 25 and the drain electrodes 16 and 26 are also formed by a single conductive layer. This allows (i) a further simplification of manufacturing processes and (ii) a further reduction in cost.

Embodiment 2

The following description will discuss Embodiment 2 of the present invention with reference to drawings. Note, however, that the descriptions of dimensions, materials, and shapes of constituent members, and their relative configurations etc. in Embodiment 2 merely exemplify an embodiment of the present invention, and therefore should not be construed as limiting the scope of the invention only to them unless otherwise noted. For convenience, identical reference numerals are given to constituent members identical with those of Embodiment 1, and detailed descriptions of such constituent members are omitted here.

(Configuration of Display Device)

Figure 8:
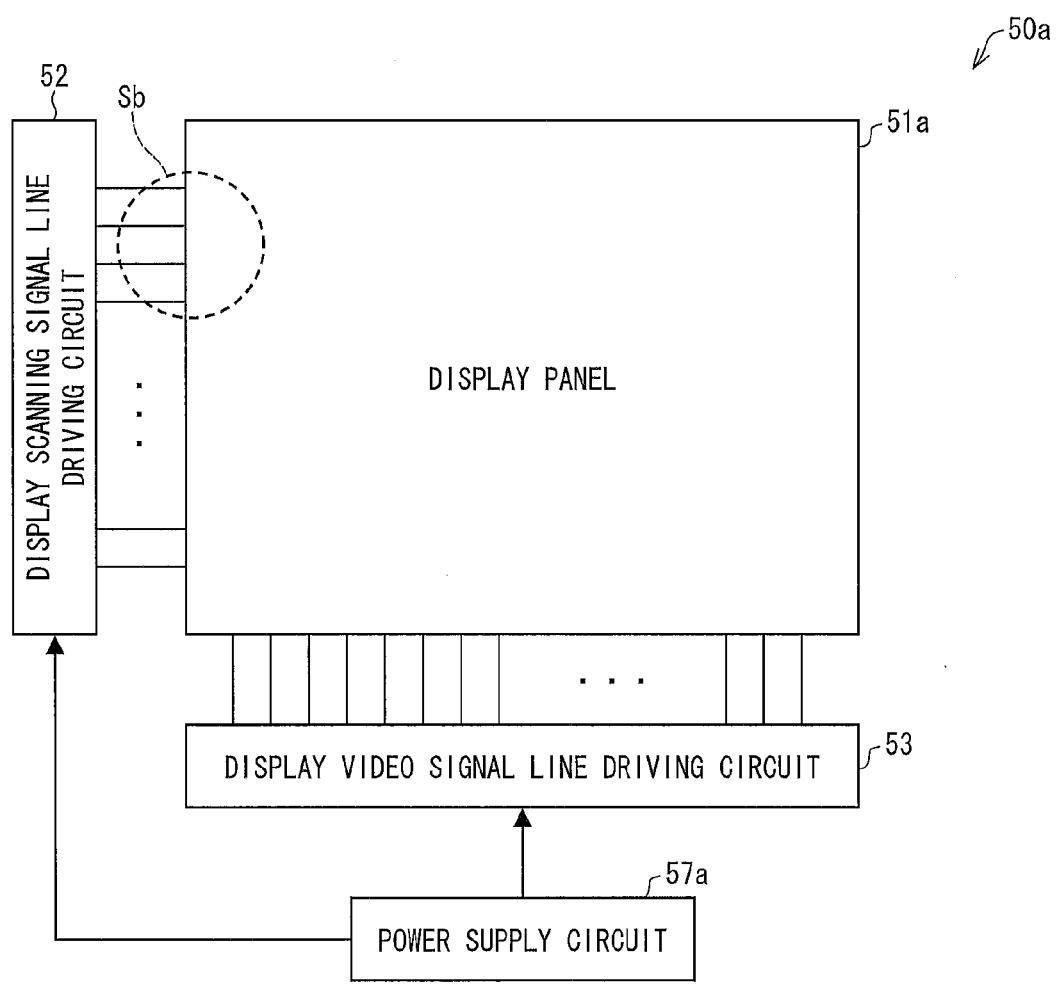
FIG. 8 is a block diagram schematically illustrating a configuration of a liquid crystal display device, in accordance with an embodiment of the present invention.

FIG. 8 is a block diagram schematically illustrating a configuration of a liquid crystal display device 50a in accordance with Embodiment 2. The liquid crystal display device 50a includes (i) a display panel 51a which does not have an optical sensor circuit 40 unlike the display panel 51, (ii) a display scanning signal line driving circuit 52, (iii) a display video signal line driving circuit 53, and (iv) a power supply circuit 57a which supplies a necessary power supply voltage to the display scanning signal line driving circuit 52 and the display video signal line driving circuit 53. Note that the configuration of the liquid crystal display device 50a is not limited to an example configuration illustrated in FIG. 8.

According to the liquid crystal display device 50a, a protection circuit is provided between (i) the display scanning signal line driving circuit 52 and (ii) respective pixel circuits in the display panel 51a. The protection circuits protect thin film elements, which constitute the respective pixel circuits, from external influence such as noise.

(Application Example of Circuit Board—Protection Circuit and Pixel Circuit)

Figure 9:
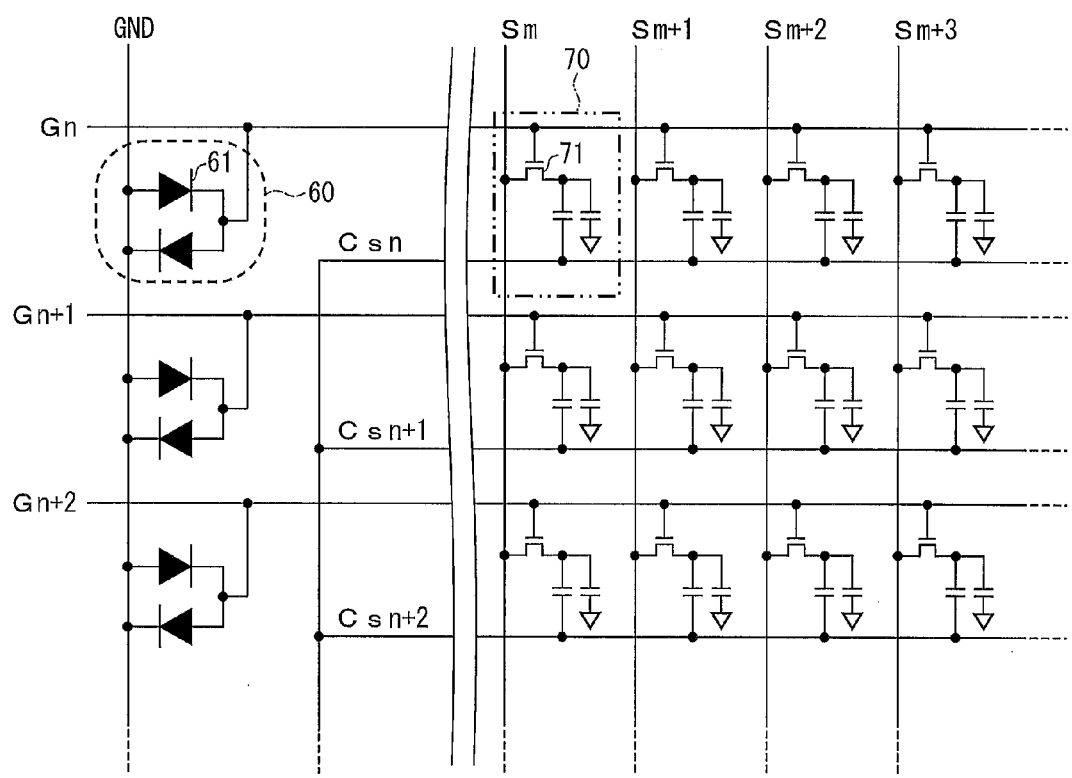
FIG. 9 is a circuit diagram illustrating a circuit configuration of protection circuits and pixel circuits provided in an area Sb illustrated in FIG. 8.

FIG. 9 is a circuit diagram illustrating a circuit configuration of protection circuits 60 and pixel circuits 70 provided in an area indicated by Sb shown in FIG. 8.

A circuit board of Embodiment 2 includes a protection circuit 60 which (i) carries out a circuit protection with respect to a first transistor element (e.g., a pixel driving TFT 71 of a pixel circuit 70) and (ii) includes a second transistor element (e.g., a TFT which serves as a diode 61). Note that the first transistor element is one of a plurality of transistor elements provided on an insulating substrate, and the second transistor element is another of the plurality of transistor elements. The first transistor element is an oxide TFT, and the second transistor element is an a-Si TFT.

In other words, the a-Si TFT is used as an element (e.g., a protection element) which needs a high resistance, and the oxide semiconductor is used as an element (e.g., a switching element) which preferably has a low resistance (i.e., high mobility). Note that, instead of the a-Si TFT, a TFT can be employed which includes a channel layer configured by (i) μc-Si or (ii) a stacking semiconductor of a-Si:H and μc-Si.

Specifically, the protection circuit 60 is a bi-directional diode including first and second diodes 61 (i) whose respective forward directions are opposite to each other and (ii) which are connected in parallel with each other (see FIG. 9). The protection circuits 60 are provided for respective gate lines Gn. The protection circuit 60 having such a configuration is also called "diode short ring". One end of the protection circuit 60 is connected with a gate line Gn, and the other end of the protection circuit 60 is connected with, for example, a ground wire.

With the configuration, it is possible to immediately form a discharging path between the gate line Gn and the ground wire, even when an excess voltage caused by static electricity, etc. is applied to the gate line Gn. This makes it possible to protect, from the excess voltage, components such as a thin film transistor constituting a pixel circuit. Further, the bi-directional diode can address both positive and negative excess voltages.

Figure 10:
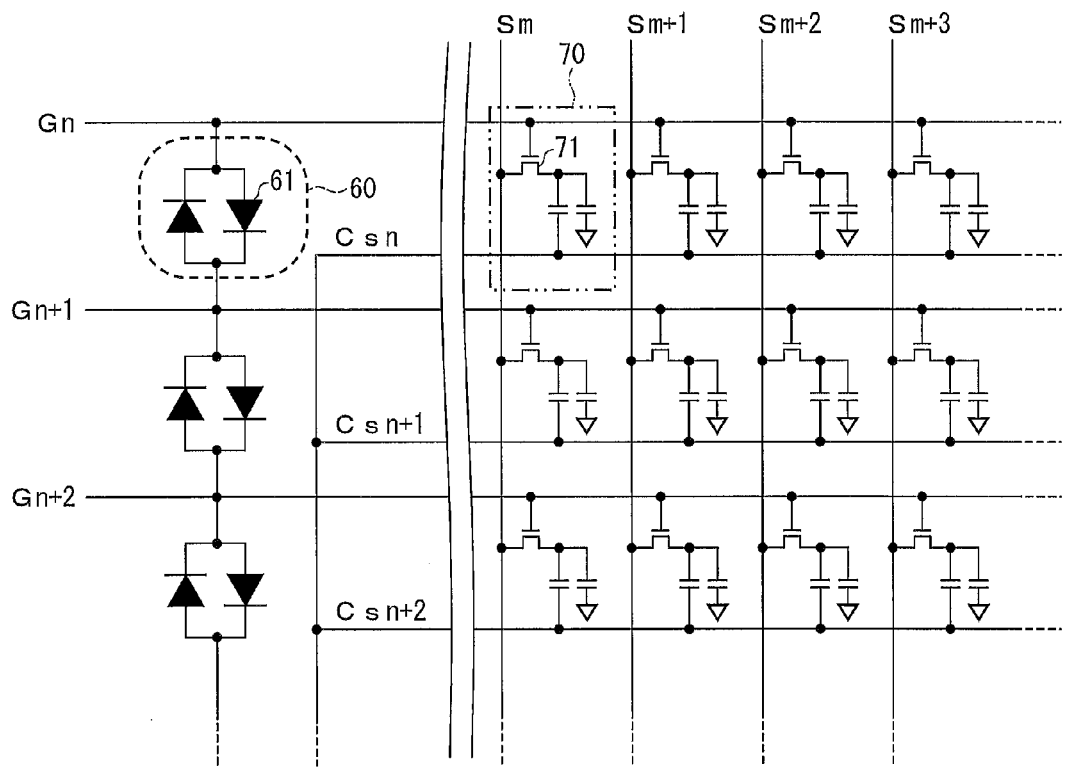
FIG. 10 is a circuit diagram illustrating another circuit configuration of the protection circuit.

A protection circuit 60 can be provided between the gate lines Gn and Gn+1 which are adjacent to each other (see FIG. 10). With the configuration, an excess voltage applied to one of the gate lines Gn and Gn+1 can be shared by the gate lines Gn and Gn+1. Therefore, it is also possible to protect a pixel circuit 70.

(Importance of Configuring Protection Circuit by a-Si TFT)

As above described, (i) an a-Si TFT or (ii) a TFT made of (a) μc-Si or (b) a stacking semiconductor of a-Si:H and μc-Si is employed as each of diodes 61 in a protection circuit 60. Such a TFT is effective for reducing (i) an area occupied by the protection circuit 60 and (ii) an area of an outer frame of the display panel 51*a*.

The oxide TFT has a characteristic that an ON-resistance is one order of magnitude smaller than that of the a-Si TFT. Therefore, in a case where oxide TFTs are employed in the protection circuit 60 of FIG. 9, there is a possibility that a current leakage will be caused between the gate line Gn and the ground wire. Similarly, in a case where oxide TFTs are employed in the protection circuit 60 of FIG. 10, there is a possibility that a current leakage will be caused between the adjacent gate lines Gn and Gn+1.

Therefore, in a case where an oxide TFT is employed as a diode 61 in the protection circuit 60, it is necessary to lengthen a channel length (L-length) of the oxide TFT (see FIG. 12) so that the oxide TFT can secure a higher ON-resistance. This necessitates an increase in size of the oxide TFT, which will, however, discourage a reduction in area of the outer frame of the display panel 51*a*.

Note that, in a case where no protection circuit 60 is provided because the reduction in area of the outer frame of the display panel 51*a* is prioritized, a problem such as a dielectric breakdown will be caused in a pixel circuit 70 and a yield rate will be decreased in manufacturing the display panel 51*a*.

In Embodiment 2, thin film transistors, having optimal characteristics in accordance with their respective different circuit roles, are thus employed as thin film transistors which have the different circuit roles and are provided on a single insulating substrate. This makes is possible to maximally improve a performance of a circuit board.

According to Embodiment 2, an oxide TFT is employed as a transistor element for carrying out a principal operation.

That is, the oxide TFT is employed as a transistor element such as (i) switching elements for respective pixels in a liquid crystal display device or (ii) a transistor element included in a driving circuit which is monolithically formed on a single insulating substrate on which the switching elements are formed. This allows an improvement in response or driving performance.

Moreover, each of transistor elements constituting a protection circuit is an a-Si TFT. This makes it possible to reduce an area of an outer frame of a display panel, and ultimately contribute to a reduction in size of a display device.

It is therefore possible to provide a circuit board and a display device in which a small-sized and high performance electric circuit is provided.

Note that the protection circuit 60 is not limited to the configurations illustrated in FIGS. 9 and 10. A protection circuit 60 can be also provided for a source line Sm as disclosed in Patent Literature 5.

(Planar Configuration of Bi-Directional Diode)

Figure 11:
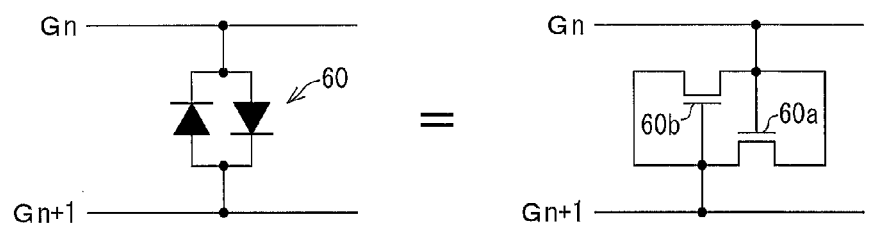
FIG. 11 is an equivalent circuit diagram illustrating, with the use of circuit symbols of a TFT, a bi-directional diode included in the protection circuit.

FIG. 11 is an equivalent circuit diagram illustrating, with the use of circuit symbols of a TFT, how a bi-directional diode constituting the protection circuit 60 is realized by two TFTs. The protection circuit 60 includes the TFT 60*a* and the TFT 60*b* in each of which a drain and a gate are short-circuited (see FIG. 11). The gate of the TFT 60*a* is connected with the gate line Gn, and the gate of the TFT 60*b* is connected with the gate line Gn+1. Furthermore, sources of the TFTs 60*a* and 60*b* are connected with the gates of the respective TFTs 60*b* and 60*a*.

Figure 12:
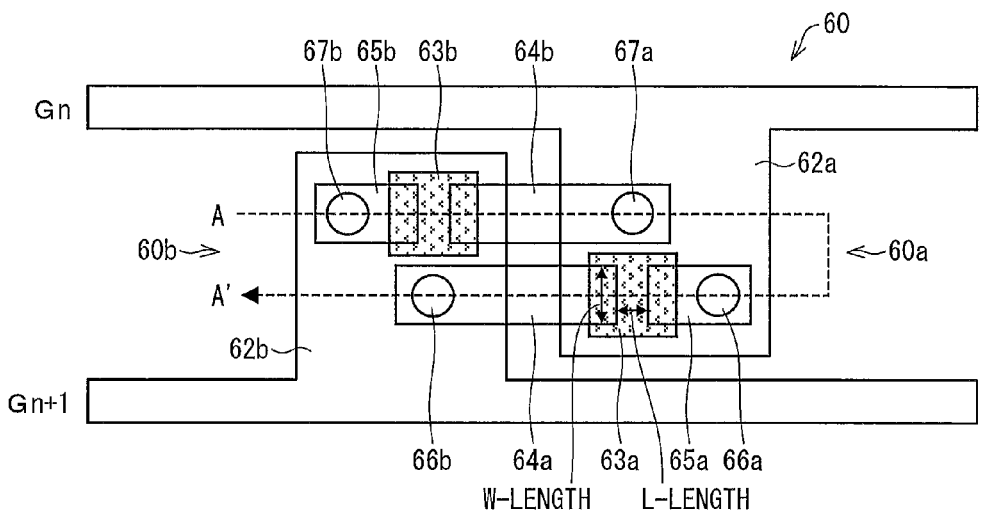
FIG. 12 is a plane view schematically illustrating the protection circuit and a TFT.

FIG. 12 is a plane view schematically illustrating the protection circuit 60 and the TFTs. The TFT 60*a* has a gate electrode 62*a* thrown out from the gate line Gn toward the gate line Gn+1, and a source electrode 64*a* and a drain electrode 65*a* face each other via a certain space on a channel layer 63*a* made from an a-Si semiconductor, which is provided above the gate electrode 62*a* (see FIG. 12).

The drain electrode 65*a* is connected with the gate electrode 62*a* via a contact hole 66*a*. The source electrode 64*a* is connected with a gate electrode 62*b* of the TFT 60*b* via a contact hole 66*b*.

The TFT 60*b* similarly has the gate electrode 62*b* thrown out from the gate line Gn+1 toward the gate line Gn, and a source electrode 64*b* and a drain electrode 65*b* face each other via a certain space on a channel layer 63*b* made from an a-Si semiconductor, which is provided above the gate electrode 62*b*.

The drain electrode 65*b* is connected with the gate electrode 62*b* via a contact hole 67*b*. The source electrode 64*a* is connected with the gate electrode 62*a* of the TFT 60*a* via a contact hole 67*a*.

According to the configuration, each of the channel layer 63*a* and the channel layer 63*b* is made from an a-Si semiconductor. Therefore, even in a case where a channel width (W-length) in the protection circuit 60 shown in FIG. 12 is made identical with that of an oxide TFT, it is possible to obtain a necessary ON-resistance by making a channel length (L-length) shorter than that of the oxide TFT.

(Cross Sectional Configuration of Bi-Directional Diode)

Figure 13:
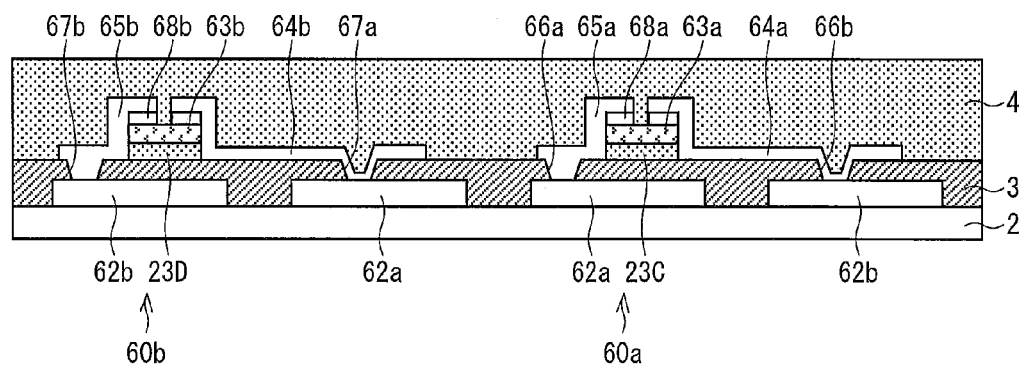
FIG. 13 is a cross sectional view schematically illustrating the protection circuit taken by the line A-A' of FIG. 12.
Figure 14:
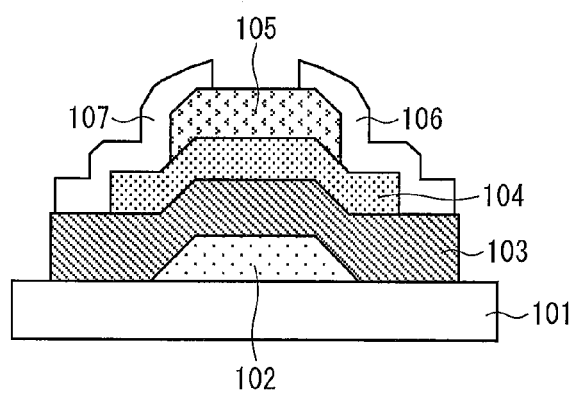
FIG. 14 is a cross sectional view illustrating a configuration of a conventional bottom-gate (inversely staggered) TFT.

FIG. 13 is a cross sectional view schematically illustrating a protection circuit 60 taken by the line A-A' of FIG. 12. TFTs 60*a* and 60*b* are (i) formed on a single insulating substrate 2 and (ii) covered with and protected by a passivation film 4 (see FIG. 13).

Gate electrodes 62*a* and 62*b* of the respective TFTs 60*a* and 60*b* are formed on the insulating substrate 2, and the gate electrodes 62*a* and 62*b* are covered with a first gate insulating film 3. Second gate insulating films 23C and 23D (each corresponding to the early described second gate insulating film 23) are deposited, on the first gate insulating film 3, so as to be located above the gate electrodes 62*a* and 62*b*, respectively.

Channel layers 63*a* and 63*b*, each made from an a-Si semiconductor, are deposited on the second gate insulating films 23C and 23D, respectively. Conductive layers 68a and 68b, each having a gap, are deposited on the channel layers 63a and 63b, respectively. A source electrode 64a and a drain electrode 65a are formed on the conductive layer 68a such that the source electrode 64a and the drain electrode 65a face each other via a certain space. A source electrode 64b and a drain electrode 65b are formed on the conductive layer 68b such that the source electrode 64b and the drain electrode 65b face each other via a certain space.

The source electrode 64a is extended over the gate electrode 62b of the TFT 60b and is connected with the gate electrode 62b via a contact hole 66b.

The drain electrode 65a is connected with the gate electrode 62a via a contact hole 66a.

Similarly, the source electrode 64b is extended over the gate electrode 62a of the TFT 60a and is connected with the gate electrode 62a via a contact hole 67a.

The drain electrode 65b is connected with the gate electrode 62b via a contact hole 67b.

The following description will supplement (i) characteristics of a circuit board in accordance with the present invention and (ii) characteristics of a method for manufacturing the circuit board.

According to the circuit board of the present invention, (5) a first gate electrode of the first thin film transistor element and a second gate electrode of the second thin film transistor element are formed by an identical conductive layer; and (6) a first source electrode and a first drain electrode of the first thin film transistor element and a second source electrode and a second drain electrode of the second thin film transistor element are formed by an identical conductive layer.

According to the configuration, as already described, in a case where the circuit board is provided in a backlight type display device, it is possible to bring about a significant effect of (i) simplifying manufacturing processes and (ii) reducing cost, without deteriorating the excellent advantages of (a) suppressing a decrease in aperture ratio of a pixel and (b) a high response speed.

In a case where, for example, the circuit board is provided in a display device including a second thin film transistor element serving as an optical sensor element, it is possible to bring about a significant effect of (i) simplifying manufacturing processes and (ii) reducing cost, without deteriorating the excellent advantage of high sensitivity to light to be sensed. Alternatively, in a case where the circuit board is provided in a display device including a second thin film transistor element serving as a circuit element constituting a protection circuit, it is possible to bring about a significant effect of (i) simplifying manufacturing processes and (ii) reducing cost, without deteriorating the excellent advantage of (a) reducing an area occupied by the protection circuit and (b) reducing an area of an outer frame of the display device, as early described in the embodiments.

According to the circuit board of the present invention, (7) a first gate insulating film composed mainly of $SiO_2$ is provided between the first channel layer and a first gate electrode of the first thin film transistor element;

(8) (i) a second gate insulating film which is composed mainly of $SiN_x$ and (ii) a third gate insulating film which is composed mainly of $SiO_2$ are provided, between the second channel layer and a second gate electrode of the second thin film transistor element, so as to be stacked in this order from a second channel layer side; and (9) the first gate insulating film and the third gate insulating film are formed as a single film.

Alternatively, according to the circuit board of the present invention,

(10) (i) a first gate insulating film which is composed mainly of $SiO_2$ and (ii) a second gate insulating film which is composed mainly of $SiN_x$ are provided, between the first channel layer and a first gate electrode of the first thin film transistor element, so as to be stacked in this order from a first channel layer side;

(11) a third gate insulating film composed mainly of $SiN_x$ is provided between the second channel layer and a second gate electrode of the second thin film transistor element; and

(12) the second gate insulating film and the third gate insulating film are formed as a single film.

According to the features (7) through (9) or the features (10) through (12), (i) an oxide semiconductor constituting the channel layer of the first thin film transistor element and (ii) non-oxide semiconductor, that is, (a) an amorphous silicon semiconductor, (b) a microcrystalline silicon semiconductor, or a semiconductor in which the semiconductors (a) and (b) are stacked, can be in contact with a gate insulating film suitable to each of the oxide semiconductor and the non-oxide semiconductor.

That is, although a characteristic of an oxide semiconductor is deteriorated by a deoxidation if a reducing material/agent is in contact with the oxide semiconductor, the configuration of the present invention can prevent a deterioration in characteristic of the oxide semiconductor because an oxide is in contact with the oxide semiconductor.

Moreover, although a characteristic of a non-oxide semiconductor is deteriorated by an oxidation if an oxide is in contact with the non-oxide semiconductor, the configuration of the present invention can prevent a deterioration in characteristic of the non-oxide semiconductor because a reducing material/agent is in contact with the non-oxide semiconductor.

Furthermore, since the $SiO_2$ layer or the $SiN_x$ layer shared by both the gate insulating films is formed as a single layer, it is possible to simplify the manufacturing processes and reduce cost.

According to the circuit board of the present invention,

(13) the first thin film transistor element and the second thin film transistor element constitute an optical sensor circuit;

(14) the first thin film transistor element serves as a sensor output section of the optical sensor circuit; and

(15) the second thin film transistor element serves as an optical sensor element of the optical sensor circuit.

According to the configuration, the first thin film transistor element having the oxide semiconductor as the channel layer can provide a high output voltage without being increased in size. This causes the first thin film transistor element to have the first characteristic that a decrease in aperture ratio of a pixel can be suppressed whereas a sensitivity of light is low. Therefore, the first thin film transistor element is suitable for a sensor output section of the optical sensor circuit.

On the other hand, the second thin film transistor element having the non-oxide semiconductor as the channel layer has the second characteristic that a sensitivity of light is high whereas an output voltage is low because of a low mobility. Therefore, the second thin film transistor element is suitable for an optical sensor element of the optical sensor circuit.

This allows the first thin film transistor element and the second thin film transistor element to constitute the optical sensor circuit which brings about excellent advantages of (a) suppression of a decrease in aperture ratio of a pixel, (b) a high sensitivity, and (c) a high response speed.

Note that such excellent advantages of the optical sensor circuit will have a significant beneficial consequence in a case where, for example, a plurality of optical sensor circuits are provided in an active matrix substrate, in which pixels having liquid crystal layer(s) are arranged in a matrix manner, so that a liquid crystal display device is designed to have a function such as a touch panel function or an image scanning function.

According to the circuit board of the present invention,

(16) the circuit board includes a protection circuit for protecting a first transistor element in a circuit, the first transistor element is one of the plurality of transistor elements, the protection circuit including a second transistor element which is another one of the plurality of transistor elements,

(17) the first transistor element is the first thin film transistor element, and

(18) the second transistor element is the second thin film transistor element.

According to the configuration, the second transistor element constituting the protection circuit is the second thin film transistor element having the non-oxide semiconductor as the channel layer. This makes it possible to reduce an area occupied by the protection circuit, as compared with a case where the second transistor element is the first thin film transistor element having the oxide semiconductor as the channel layer.

Moreover, since the first transistor element to be protected in the circuit is the first thin film transistor element, it is possible to improve response or driving performance of a transistor element, which carries out a principal operation, such as (i) switching elements for respective pixels in a liquid crystal display device or (ii) a transistor element included in a driving circuit which is monolithically formed on a single insulating substrate on which the switching elements are formed.

As such, by providing transistor elements suitable for respective circuit roles on the single insulating substrate, it is possible to provide a circuit board including a small-sized and high performance electric circuit.

The display device of the present invention includes any of the circuit boards above described.

According to the configuration, it is possible to provide a display device which brings about the advantages of the circuit boards above described.

According to the method of the present invention,

(23) the step (2) includes the step of forming a first insulating layer for covering the first and second gate electrodes by use of an insulating material suitable for a semiconductor by which the first channel layer is formed; and

(24) the step (2) includes the step of forming a second insulating layer locally on the first insulating layer in a location corresponding to a location where the second channel layer of the second thin film transistor element is formed, by use of an insulating material suitable for a semiconductor by which the second channel layer is formed.

Alternatively, according to the method of the present invention,

(25) the step (2) includes the step of forming a first insulating layer for covering the first and second gate electrodes by use of an insulating material suitable for a semiconductor by which the second channel layer is formed; and

(26) the step (2) includes the step of forming a second insulating layer locally on the first insulating layer in a location corresponding to a location where the first channel layer of the first thin film transistor element is formed, by use of an insulating material suitable for a semiconductor by which the first channel layer is formed.

According to the features (23) and (24) or the features (25) and (26), as above described for the circuit board of the present invention, it is particularly possible to manufacture a high performance circuit board at low cost, which circuit board does not deteriorate the characteristics of the first thin film transistor element and the second thin film transistor element.

The present invention is not limited to the embodiments, but can be altered by a skilled person in the art within the scope of the claims. An embodiment derived from a proper combination of technical means disclosed in respective different embodiments is also encompassed in the technical scope of the present invention.

INDUSTRIAL APPLICABILITY

The present invention is applicable to (i) a circuit board including a plurality of TFTs that have different types of semiconductor layers and (ii) an electronic device such as a display device which includes the circuit board.

REFERENCE SIGNS LIST

1: Circuit board
1A: Circuit board
2: Insulating substrate
3: First gate insulating film (first insulating layer)
3A: First gate insulating film (first insulating layer)
10: Oxide TFT (transistor element, first thin film transistor element)
10A: Oxide TFT (transistor element, first thin film transistor element)
11: Channel layer
12: Gate electrode
15: Source electrode
16: Drain electrode
20: a-Si TFT (transistor element, second thin film transistor element)
20A: a-Si TFT (transistor element, second thin film transistor element)
21: Channel layer
22: Gate electrode
23: Second gate insulating film (second insulating layer)
23A: Second gate insulating film (second insulating layer)
25: Source electrode
26: Drain electrode
30: Pixel
40: Optical sensor circuit
50: Liquid crystal display device (display device)
50a: Liquid crystal display device (display device)
60: Protection circuit
60a: TFT (second transistor element)
60b: TFT (second transistor element)
71: Pixel driving TFT (first thin film transistor element)

The invention claimed is:

1. A circuit board comprising:
an insulating substrate; and
a plurality of transistor elements provided on the insulating substrate, the plurality of transistor elements being provided for (i) respective pixels arranged in a matrix manner or (ii) respective pixels in a group of a predetermined number of the pixels,
at least one of the plurality of transistor elements being a first thin film transistor element having a first channel layer formed by an oxide semiconductor,
at least another one of the plurality of transistor elements being a second thin film transistor element having a second channel layer formed by (i) an amorphous silicon semiconductor, (ii) a microcrystalline silicon semiconductor, or (iii) a semiconductor in which the amorphous silicon semiconductor and the microcrystalline silicon semiconductor are stacked, each of the first thin film transistor element and the second thin film transistor element being a bottom-gate transistor, a first gate insulating film composed mainly of $SiO_2$ being provided between the first channel layer and a first gate electrode of the first thin film transistor element, (i) a second gate insulating film which is composed mainly of $SiN_x$ and (ii) a third gate insulating film which is composed mainly of $SiO_2$ being provided, between the second channel layer and a second gate electrode of the second thin film transistor element, so as to be stacked in this order from a second channel layer side, the first gate insulating film and the third gate insulating film being formed as a single film, the first thin film transistor element and the second thin film transistor element constituting an optical sensor circuit, the first thin film transistor element serving as a sensor output section of the optical sensor circuit, and the second thin film transistor element serving as an optical sensor element of the optical sensor circuit.

2. A circuit board comprising:

an insulating substrate;

a plurality of transistor elements provided on the insulating substrate, the plurality of transistor elements being provided for (i) respective pixels arranged in a matrix manner or (ii) respective pixels in a group of a predetermined number of the pixels; and a protection circuit for protecting a first transistor element in a circuit, the first transistor element being one of the plurality of transistor elements, the protection circuit including a second transistor element which is another one of the plurality of transistor elements, at least one of the plurality of transistor elements being a first thin film transistor element having a first channel layer formed by an oxide semiconductor, at least another one of the plurality of transistor elements being a second thin film transistor element having a second channel layer formed by (i) an amorphous silicon semiconductor, (ii) a microcrystalline silicon semiconductor, or (iii) a semiconductor in which the amorphous silicon semiconductor and the microcrystalline silicon semiconductor are stacked, each of the first thin film transistor element and the second thin film transistor element being a bottom-gate transistor, a first gate insulating film composed mainly of $SiO_2$ being provided between the first channel layer and a first gate electrode of the first thin film transistor element, (i) a second gate insulating film which is composed mainly of $SiN_x$ and (ii) a third gate insulating film which is composed mainly of $SiO_2$ being provided, between the second channel layer and a second gate electrode of the second thin film transistor element, so as to be stacked in this order from a second channel layer side, the first gate insulating film and the third gate insulating film being formed as a single film, the first transistor element being the first thin film transistor element, and the second transistor element being the second thin film transistor element.

3. A circuit board comprising:

an insulating substrate; and a plurality of transistor elements provided on the insulating substrate, the plurality of transistor elements being provided for (i) respective pixels arranged in a matrix manner or (ii) respective pixels in a group of a predetermined number of the pixels, at least one of the plurality of transistor elements being a first thin film transistor element having a first channel layer formed by an oxide semiconductor, at least another one of the plurality of transistor elements being a second thin film transistor element having a second channel layer formed by (i) an amorphous silicon semiconductor, (ii) a microcrystalline silicon semiconductor, or (iii) a semiconductor in which the amorphous silicon semiconductor and the microcrystalline silicon semiconductor are stacked, each of the first thin film transistor element and the second thin film transistor element being a bottom-gate transistor, (i) a first gate insulating film which is composed mainly of $SiO_2$ and (ii) a second gate insulating film which is composed mainly of $SiN_x$ being provided, between the first channel layer and a first gate electrode of the first thin film transistor element, so as to be stacked in this order from a first channel layer side, a third gate insulating film composed mainly of $SiN_x$ being provided between the second channel layer and a second gate electrode of the second thin film transistor element, the second gate insulating film and the third gate insulating film being formed as a single film, the first thin film transistor element and the second thin film transistor element constituting an optical sensor circuit, the first thin film transistor element serving as a sensor output section of the optical sensor circuit, and the second thin film transistor element serving as an optical sensor element of the optical sensor circuit.

4. A circuit board comprising:

an insulating substrate;

a plurality of transistor elements provided on the insulating substrate, the plurality of transistor elements being provided for (i) respective pixels arranged in a matrix manner or (ii) respective pixels in a group of a predetermined number of the pixels; and a protection circuit for protecting a first transistor element in a circuit, the first transistor element being one of the plurality of transistor elements, the protection circuit including a second transistor element which is another one of the plurality of transistor elements, at least one of the plurality of transistor elements being a first thin film transistor element having a first channel layer formed by an oxide semiconductor, at least another one of the plurality of transistor elements being a second thin film transistor element having a second channel layer formed by (i) an amorphous silicon semiconductor, (ii) a microcrystalline silicon semiconductor, or (iii) a semiconductor in which the amorphous silicon semiconductor and the microcrystalline silicon semiconductor are stacked, each of the first thin film transistor element and the second thin film transistor element being a bottom-gate transistor, (i) a first gate insulating film which is composed mainly of $SiO_2$ and (ii) a second gate insulating film which is composed mainly of $SiN_x$ being provided, between the first channel layer and a first gate electrode of the first thin film transistor element, so as to be stacked in this order from a first channel layer side, a third gate insulating film composed mainly of SiN$_x$ being provided between the second channel layer and a second gate electrode of the second thin film transistor element, the second gate insulating film and the third gate insulating film being formed as a single film, the first transistor element being the first thin film transistor element, and the second transistor element being the second thin film transistor element.

5. The circuit board as set forth in claim 1, wherein:

a first gate electrode of the first thin film transistor element and a second gate electrode of the second thin film transistor element are formed by an identical conductive layer; and a first source electrode and a first drain electrode of the first thin film transistor element and a second source electrode and a second drain electrode of the second thin film transistor element are formed by an identical conductive layer.

6. The circuit board as set forth in claim 2, wherein:

a first gate electrode of the first thin film transistor element and a second gate electrode of the second thin film transistor element are formed by an identical conductive layer; and a first source electrode and a first drain electrode of the first thin film transistor element and a second source electrode and a second drain electrode of the second thin film transistor element are formed by an identical conductive layer.

7. The circuit board as set forth in claim 3, wherein:

a first gate electrode of the first thin film transistor element and a second gate electrode of the second thin film transistor element are formed by an identical conductive layer; and a first source electrode and a first drain electrode of the first thin film transistor element and a second source electrode and a second drain electrode of the second thin film transistor element are formed by an identical conductive layer.

8. The circuit board as set forth in claim 4, wherein:

a first gate electrode of the first thin film transistor element and a second gate electrode of the second thin film transistor element are formed by an identical conductive layer; and a first source electrode and a first drain electrode of the first thin film transistor element and a second source electrode and a second drain electrode of the second thin film transistor element are formed by an identical conductive layer.

9. The circuit board as set forth in claim 1, wherein the oxide semiconductor contains In, Ga, Zn, and O.

10. The circuit board as set forth in claim 2, wherein the oxide semiconductor contains In, Ga, Zn, and O.

11. The circuit board as set forth in claim 3, wherein the oxide semiconductor contains In, Ga, Zn, and O.

12. The circuit board as set forth in claim 4, wherein the oxide semiconductor contains In, Ga, Zn, and O.

13. A display device comprising a circuit board recited in claim 1.

14. A display device comprising a circuit board recited in claim 2.

15. A display device comprising a circuit board recited in claim 3.

16. A display device comprising a circuit board recited in claim 4.

* * * * *